(12) United States Patent
Zhang et al.

(10) Patent No.: US 9,627,303 B2
(45) Date of Patent: Apr. 18, 2017

(54) ETCHING-BEFORE-PACKAGING THREE-DIMENSIONAL SYSTEM-LEVEL METAL CIRCUIT BOARD STRUCTURE INVERSELY PROVIDED WITH CHIP, AND TECHNOLOGICAL METHOD

(71) Applicant: Jiangsu Changjiang Electronics Technology Co., Ltd, Jiangsu (CN)

(72) Inventors: Youhai Zhang, Jiangsu (CN); Kai Zhang, Jiangsu (CN); Xiaojing Liao, Jiangsu (CN); Yaqin Wang, Jiangsu (CN); Sunyan Wang, Jiangsu (CN)

(73) Assignee: Jiangsu Changjiang Electronics Technology Co., Ltd, Jiangsu (CN)

( * ) Notice: Subject to any disclaimer, the term of this patent is extended or adjusted under 35 U.S.C. 154(b) by 0 days.

(21) Appl. No.: 14/901,451

(22) PCT Filed: Dec. 2, 2013

(86) PCT No.: PCT/CN2013/088298
§ 371 (c)(1),
(2) Date: Dec. 28, 2015

(87) PCT Pub. No.: WO2015/018143
PCT Pub. Date: Feb. 12, 2015

(65) Prior Publication Data
US 2016/0351482 A1 Dec. 1, 2016

(30) Foreign Application Priority Data

Aug. 6, 2013 (CN) .......................... 2013 1 0340428

(51) Int. Cl.
*H01L 21/00* (2006.01)
*H01L 23/495* (2006.01)
(Continued)

(52) U.S. Cl.
CPC ........ *H01L 23/49575* (2013.01); *H01L 21/48* (2013.01); *H01L 21/4821* (2013.01);
(Continued)

(58) Field of Classification Search
CPC ........... H01L 23/49575; H01L 21/4825; H01L 21/4853; H01L 21/00; H01L 23/495; H01L 23/498; H01L 21/48
See application file for complete search history.

(56) References Cited

U.S. PATENT DOCUMENTS 6,235,552 B1 * 5/2001 Kwon ................. H01L 23/3114
257/E21.508
6,270,263 B1 * 8/2001 Iwase ................... G02B 6/4292
385/14

(Continued)

FOREIGN PATENT DOCUMENTS

CN 2636411 Y 8/2004
CN 2664198 Y 12/2004

(Continued)

OTHER PUBLICATIONS

State Intellectual Property Office (P.R.C.), Chinese Office Action for Application No. 201310340428.6, mailed Jul. 24, 2015.

(Continued)

*Primary Examiner* — Caleb Henry
(74) *Attorney, Agent, or Firm* — Honigman Miller Schwartz and Cohn LLP; Matthew H. Szalach; Jonathan P. O'Brien

(57) ABSTRACT

Provided is an etching-before-packaging three-dimensional system-level metal circuit board structure inversely provided with a chip. The structure comprises a metal substrate frame, wherein a base island and pins are arranged in the metal substrate frame; a chip is inversely arranged on a front face of the base island and the pins; a conductive pillar is
(Continued)

arranged on a front face of the pins; the region on the periphery of the base island, the region between the base island and the pins, the region between one pin and another, the region above the base island and the pins, the region below the base island and the pins, and the outside of the chip and the conductive pillar are all enveloped with a plastic packaging material.

20 Claims, 17 Drawing Sheets

(51) Int. Cl.
    *H01L 23/498* (2006.01)
    *H01L 21/48* (2006.01)
    *H01L 23/31* (2006.01)
    *H01L 21/56* (2006.01)

(52) U.S. Cl.
    CPC ...... *H01L 21/4825* (2013.01); *H01L 21/4853* (2013.01); *H01L 21/4857* (2013.01); *H01L 21/561* (2013.01); *H01L 23/3107* (2013.01); *H01L 23/49517* (2013.01); *H01L 23/49811* (2013.01); *H01L 23/49822* (2013.01); *H01L 21/568* (2013.01); *H01L 2224/16* (2013.01); *H01L 2224/16225* (2013.01); *H01L 2224/45147* (2013.01); *H01L 2224/48091* (2013.01); *H01L 2224/73204* (2013.01); *H01L 2224/73265* (2013.01); *H01L 2924/181* (2013.01); *H01L 2924/19105* (2013.01); *H01L 2924/19107* (2013.01)

(56) References Cited

U.S. PATENT DOCUMENTS

| | | | | |
|---|---|---|---|---|
| 6,306,682 B1 * | 10/2001 | Huang | ...... | H01L 21/56 257/E21.502 |
| 6,498,099 B1 * | 12/2002 | McLellan | ...... | H01L 21/4832 257/E23.043 |
| 6,559,540 B2 * | 5/2003 | Kawashima | ...... | H01L 23/3171 257/737 |
| 6,686,652 B1 * | 2/2004 | Bayan | ...... | H01L 21/4842 257/678 |
| 6,956,283 B1 * | 10/2005 | Peterson | ...... | B81B 7/0025 257/680 |
| 6,987,031 B2 * | 1/2006 | Eng | ...... | H01L 21/4857 257/E21.705 |
| 7,145,225 B2 * | 12/2006 | Lee | ...... | H01L 23/3677 257/684 |
| 7,816,187 B2 * | 10/2010 | Huang | ...... | H01L 21/4832 257/690 |
| 8,063,470 B1 * | 11/2011 | Sirinorakul | ...... | H01L 21/4832 257/666 |
| 8,735,224 B2 * | 5/2014 | Do | ...... | H01L 21/4832 257/676 |
| 9,281,258 B1 * | 3/2016 | Fon | ...... | H01L 23/3121 |
| 2004/0195664 A1 * | 10/2004 | Chiu | ...... | G06K 9/00053 257/676 |
| 2004/0259289 A1 * | 12/2004 | Hubbard | ...... | H01L 23/4985 438/108 |
| 2005/0200007 A1 * | 9/2005 | Liu | ...... | H01L 23/50 257/724 |
| 2006/0079027 A1 * | 4/2006 | Yamada | ...... | H01L 21/4857 438/121 |
| 2007/0126112 A1 * | 6/2007 | Cho | ...... | H05K 1/056 257/700 |
| 2007/0141756 A1 * | 6/2007 | Iitani | ...... | H01L 21/4821 438/123 |
| 2008/0289866 A1 * | 11/2008 | Yuri | ...... | H01L 23/49822 174/260 |
| 2009/0004784 A1 * | 1/2009 | Huang | ...... | H01L 21/4832 438/124 |
| 2010/0052146 A1 * | 3/2010 | Jiang | ...... | H01L 21/561 257/690 |
| 2010/0258921 A1 * | 10/2010 | Chang Chien | ...... | H01L 21/4832 257/676 |
| 2011/0057298 A1 * | 3/2011 | Ramos | ...... | H01L 24/36 257/667 |
| 2011/0115069 A1 * | 5/2011 | Teh | ...... | H01L 21/486 257/693 |
| 2011/0163433 A1 * | 7/2011 | Toda | ...... | H01L 21/4828 257/676 |
| 2012/0018867 A1 * | 1/2012 | Toda | ...... | H01L 21/4828 257/676 |
| 2012/0038036 A1 * | 2/2012 | Chun | ...... | H01L 21/4832 257/677 |
| 2016/0141233 A1 * | 5/2016 | Liang | ...... | H01L 23/49575 257/676 |
| 2016/0148861 A1 * | 5/2016 | Liang | ...... | H01L 23/49517 257/676 |
| 2016/0163622 A1 * | 6/2016 | Liang | ...... | H01L 23/3128 257/676 |

FOREIGN PATENT DOCUMENTS

| | | |
|---|---|---|
| CN | 102456677 A | 5/2012 |
| CN | 102723282 A | 10/2012 |
| CN | 102723284 A | 10/2012 |
| CN | 102723292 A | 10/2012 |
| CN | 102723293 A | 10/2012 |
| CN | 103400771 A | 11/2013 |
| KR | 20130077033 A | 7/2013 |

OTHER PUBLICATIONS

International Searching Authority, International Search Report for International Application No. PCT/CN2013/088298, mailed May 19, 2014.

* cited by examiner

ETCHING-BEFORE-PACKAGING THREE-DIMENSIONAL SYSTEM-LEVEL METAL CIRCUIT BOARD STRUCTURE INVERSELY PROVIDED WITH CHIP, AND TECHNOLOGICAL METHOD

This application is a national phase of International Application No. PCT/CN2013/088298, titled "ETCHING-BEFORE-PACKAGING THREE-DIMENSIONAL SYSTEM-LEVEL METAL CIRCUIT BOARD STRUCTURE INVERSELY PROVIDED WITH CHIP, AND TECHNOLOGICAL METHOD", filed on Dec. 2, 2013, which claims the priority to Chinese Patent Application No. 201310340428.6, titled "FIRST-ETCHED AND LATER-PACKAGED FLIP-CHIP THREE-DIMENSIONAL SYSTEM-IN-PACKAGE METAL CIRCUIT BOARD STRUCTURE, AND MANUFACTURING METHOD THEREOF" and filed with the Chinese State Intellectual Property Office on Aug. 6, 2013, the disclosures of which are incorporated herein by reference in their entirety.

FIELD

The present disclosure relates to a first-etched and later-packaged flip chip three-dimensional system-in-package metal circuit board structure and a manufacturing method thereof, belonging to the field of semiconductor packaging technology.

BACKGROUND

A traditional metal lead frame may be manufactured typically by one of the following four methods.

1) Punching is performed on a metal sheet from top to down or from down to top in a longitudinal way by a punching technology with a mechanical upper and lower tool, to form a pad carrying a chip, inner pins for signal transmission and outer pins for connecting to an outside PCB of a lead frame inside of the metal sheet, then a metal electroplated layer is then coated on certain areas of the inner pins and (or) the pad, to form a finished lead frame which can be used (with reference to FIG. 70 to FIG. 72).

2) Exposing, developing, windowing and chemical etching are performed on a metal sheet by a chemical etching technology, to form a pad carrying a chip, inner pins for signal transmission and outer pins for connecting to an outside PCB of a lead frame inside of the metal sheet, then a metal electroplated layer is then coated on certain areas of the inner pins and (or) the pad, to form a finished lead frame which can be used (with reference to FIG. 73 and FIG. 74).

3) Based on the first method and the second method, in a third method, a high-temperature adhesive film resistive to 260 Celsius degrees is applied onto a back face of the lead frame in which the pad carrying the chip, the inner pins for signal transmission and the outer pins for connecting to the outside PCB are disposed and the metal electroplated layer is coated on the certain areas of the inner pins and (or) the pad, to form a lead frame which can be packaged in a way of no pin at four sides and in a way of reducing a package size (with reference to FIG. 75).

4) By using the first method and the second method, in a fourth method, the lead frame, in which the pad carrying the chip, the inner pins for signal transmission and the outer pins for connecting to the outside PCB are disposed and the metal electroplated layer is coated on the certain areas of the inner pins and (or) the pad, is prepackaged, and thermosetting epoxy resin is filled inside regions of the metal sheet where the punching is performed or the chemical etching is performed, to form a pre-filler lead frame which can be packaged in a way of no pin at four sides, in a way of reducing a package size and in a way of copper wire bonding (with reference to FIG. 76).

The traditional method has the following disadvantages.

1) Lead Frames Produced by Mechanical Punching a. In mechanical punching, the upper and lower tool is used to perform punching from top to down or from down to top, so as to form a vertical cross section, therefore it is unable to add other functions or embody other objects inside of the lead frame, such as, objects of the system desired to be integrated in the metal lead frame;

b. In mechanical stamping, the upper and lower tool is used to press edges of the metal sheet to form an extended metal area, and the length of the extended metal area due to the press is at most 80 percent of the thickness of the lead frame. In a case that the length of the extended metal area is greater than 80 percent of the thickness of the lead frame, the extended metal area due to the press is easy to occur problems such as warp, crack and break, irregular shape and surface pores, and an ultra-thin lead frame is more easy to result in the above problems (with reference to FIG. 77 and FIG. 78); and c. In a case that the length of the metal area extended by the mechanical stamping is less than or equal to 80 percent of the thickness of the lead frame, objects can not be disposed in the extended metal area since the length of the extended metal area is not enough (especially in a case that the lead frame has a ultra-thin thickness) (with reference to FIG. 79 and FIG. 80).

2) Lead Frames Produced by the Chemical Etching Technology a. In subtracting etching, half etching technology may be used to etch space of objects required to be embedded, however, the biggest disadvantages thereof is that the depth of the etching and flatness of a plane formed after the etching are uncontrollable.

b. After the space of objects required to be embedded are formed in the metal sheet by the half etching, strength of the structure of the lead frame becomes soft, which will have a direct influence on difficulty of working conditions (for example, pick-and-place, transport, high temperature, high pressure and thermal stress shrinkage) required when an object is embedded subsequently; and c. In the lead frame produced by the chemical etching technology, at most an outer lead pattern or an inner lead pattern on a front face and a back face of the lead frame are presented, it is unable to present system-in-package metal lead frame of multi-layer three-dimensional metal circuit.

SUMMARY

In order to solve the disadvantages described above, the present disclosure provides a first-etched and later-packaged flip chip three-dimensional system-in-package metal circuit board structure and a manufacturing method thereof, which can solve the problem that functionality and application of a traditional metal lead frame is limited due to the fact that objects cannot be embedded in the metal lead frame.

The present disclosure provides a method for manufacturing a first-etched and later-packaged flip chip three-dimensional system-in-package metal circuit board, including:

step 1, preparing a metal substrate;

step 2, pre-plating a thin layer of copper on surfaces of the metal substrate;

step 3, applying photoresist films, where the photoresist films for exposing and developing are applied on a front face and a back face of the metal substrate on which the thin layer of copper has been pre-plated, respectively;

step 4, removing partially the photoresist film on the back face of the metal substrate, where exposing and developing for patterning are performed, by using an exposing and developing device, on the back face of the metal substrate on which the photoresist film has been applied in step 3, to partially remove and pattern the photoresist film, to expose a pattern of regions on the back face of the metal substrate to be plated subsequently;

step 5, plating a metal wiring layer, where the metal wiring layer is plated on the regions on the back face of the metal substrate exposed by partially removing the photoresist film in step 4;

step 6, applying a photoresist film, where the photoresist film for exposing and developing is applied on the back face of the metal substrate processed in step 5;

step 7, removing partially the photoresist film on the back face of the metal substrate, where exposing and developing for patterning are performed, by using the exposing and developing device, on the back face of the metal substrate on which the photoresist film has been applied in step 6, to partially remove and pattern the photoresist film, to expose a pattern of regions on the back face of the metal substrate to be plated subsequently;

step 8, plating a high electrical conductive metal wiring layer, where the high electrical conductive metal wiring layer is plated on the regions on the back face of the metal substrate exposed by removing partially the photoresist film in step 7;

step 9, removing the photoresist films, where the photoresist films on the surfaces of the metal substrate are removed;

step 10, performing epoxy resin molding, where the epoxy resin molding for protection function is performed on a surface of the metal wiring layer on the back face of the metal substrate;

step 11, performing grinding on a surface of the epoxy resin, where the grinding is performed on the surface of the epoxy resin after the epoxy resin molding is performed;

step 12, applying photoresist films, where the photoresist films for exposing and developing are applied on the front face and the back face of the metal substrate on which step 11 has been performed;

step 13, removing partially the photoresist film on the front face of the metal substrate, where exposing and developing for patterning are performed, by using the exposing and developing device, on the front face of the metal substrate on which the photoresist film has been applied in step 12, to partially remove and pattern the photoresist film, to expose a pattern of a region on the front face of the metal substrate where etching is to be performed subsequently;

step 14, performing chemical etching, where the chemical etching is performed on the region on the front face of the metal substrate where exposing and developing have been performed in step 13;

step 15, applying photoresist films, where the photoresist films for exposing and developing are applied on the front face and the back face of the metal substrate on which step 14 has been performed;

step 16, removing partially the photoresist film on the front face of the metal substrate, where exposing and developing for patterning are performed, by using the exposing and developing device, on the front face of the metal substrate on which the photoresist film has been applied in step 15, to partially remove and pattern the photoresist film, to expose a pattern of regions on the front face of the metal substrate to be plated subsequently;

step 17, plating metal pillars, where the metal pillars are plated on the regions on the front face of the metal substrate exposed by removing partially the photoresist film in step 16;

step 18, removing the photoresist films, where the photoresist films on the surfaces of the metal substrate are removed;

step 19, installing a chip, where the chip is installed on a pad and pins, for which step 18 has been performed, with underfill in a flip manner;

step 20, performing encapsulating, where the front face of the metal substrate processed in step 19 is molded with molding compound;

step 21, performing grinding on a surface of the epoxy resin, where the grinding is performed on the surface of the epoxy resin after the epoxy resin molding has been performed in step 20; and step 22, plating an anti-oxidation metal layer or coating antioxidant (OSP), where the anti-oxidation metal layer is plated on exposed metal surfaces of the metal substrate on which step 21 has been performed or the antioxidant (OSP) is coated on the exposed metal surfaces.

Step 15 may be performed after step 4 and before step 5.

An first-etched and later-packaged flip chip three-dimensional system-in-package metal circuit board structure includes a metal substrate frame; a pad and pins disposed inside of the metal substrate frame; a chip installed on front faces or back faces of the pad and the pins with underfill in a flip manner; electrical conductive pillars disposed on front faces or back faces of the pins; molding compound encapsulated at a peripheral region of the pad, a region between the pad and the pins, a region between the pins, a region above the pad and the pins, a region below the pad and the pins and outside of the chip and the electrical conductive pillars, where a top of the molding compound flushes with tops of the electrical conductive pillars; and an anti-oxidation metal layer is plated on or antioxidant is coated on surfaces of the metal substrate frame, the pins and the electrical conductive pillars exposing out of the molding compound.

An first-etched and later-packaged flip chip three-dimensional system-in-package metal circuit board structure includes: a metal substrate frame and a chip; pins disposed inside of the metal substrate frame; the chip installed on front faces or back faces of the pins with underfill in a flip manner; electrical conductive pillars disposed on the front faces or the back faces of the pins; molding compound encapsulated at a region between the pins, a region above the pins, a region below the pins, and outside of the chip and the electrical conductive pillars, where a top of the molding compound flushes with tops of the electrical conductive pillars; and an anti-oxidation metal layer is plated on or antioxidant (OSP) is coated on surfaces of the metal substrate frame, the pins and the electrical conductive pillars exposing out of the molding compound.

A passive device is connected between the pins via electrical conductive adhesive substance, and the passive device may be connected between front faces of the pins, or may be connected between front faces of the pins and a front face of an electro-static discharge ring, or may be connected between the front face of the electro-static discharge ring and a front face of the pad, the electro-static discharge ring is disposed between the pad and the pins, and the front face of the chip is connected to the front face of the electro-static discharge ring by a metal wire.

The electrical conductive pillars are arranged into multiple rings.

A second chip is disposed on a front face of the chip via electrical conductive adhesive substance or non-electrical conductive adhesive substance, and a front face of the second chip is connected to the pins by metal wires.

Second electrical conductive pillars are disposed on the front faces or the back faces of the pins, and a second chip is installed on the second electrical conductive pillars via electrical conductive substance in a flip manner, the second electrical conductive pillars and the second chip are located inside of the molding compound.

Second electrical conductive pillars are disposed on the front faces or the back faces of the pins, and a passive device is installed on the second electrical conductive pillars, the second electrical conductive pillars and the passive device are located inside of the molding compound.

A method for manufacturing a first-etched and later-packaged flip chip three-dimensional system-in-package metal circuit board is provided, including:

step 1, preparing a metal substrate;

step 2, pre-plating a thin layer of copper on surfaces of the metal substrate;

step 3, applying photoresist films, where the photoresist films for exposing and developing are applied on a front face and a back face of the metal substrate on which the thin layer of copper has been pre-plated, respectively;

step 4, removing partially the photoresist film on the front face of the metal substrate, where exposing and developing for patterning are performed, by using an exposing and developing device, on the front face of the metal substrate on which the photoresist film has been applied in step 3, to partially remove and pattern the photoresist film, to expose a pattern of regions on the front face of the metal substrate to be plated subsequently;

step 5, plating a first metal wiring layer, where the first metal wiring layer is plated on the regions on the front face of the metal substrate exposed by partially removing the photoresist film in step 4;

step 6, applying a photoresist film, where the photoresist film for exposing and developing is applied on the front face of the metal substrate processed in step 5;

step 7, removing partially the photoresist film on the front face of the metal substrate, where exposing and developing for patterning are performed, by using the exposing and developing device, on the front face of the metal substrate on which the photoresist film has been applied in step 6, to partially remove and pattern the photoresist film, to expose a pattern of regions on the front face of the metal substrate to be plated subsequently;

step 8, plating a second metal wiring layer, where the second metal wiring layer, served as electrical conductive pillars for connecting the first metal wiring layer and a third metal wiring layer, is plated on the regions on the front face of the metal substrate exposed by partially removing the photoresist film in step 7;

step 9, removing the photoresist films, where the photoresist films on the surfaces of the metal substrate are removed;

step 10, applying a non-electrical conductive adhesive film, where a layer of non-electrical conductive adhesive film is applied on the front face of the metal substrate;

step 11, performing grinding on a surface of the non-electrical conductive adhesive film, where the grinding is performed on the surface of the applied non-electrical conductive adhesive film;

step 12, performing metallization preprocessing on the surface of the non-electrical conductive adhesive film, where the metallization preprocessing is performed on the surface of the non-electrical conductive adhesive film;

step 13, applying photoresist films, where the photoresist films for exposing and developing are applied on the front face and the back face of the metal substrate processed in step 12;

step 14, removing partially the photoresist film on the front face of the metal substrate, where exposing and developing for patterning are performed, by using the exposing and developing device, on the front face of the metal substrate on which the photoresist film has been applied in step 13, to partially remove and pattern the photoresist film, to expose a pattern of regions on the front face of the metal substrate where etching is to be performed subsequently;

step 15, performing etching, where the etching is performed on the regions where windowing has been performed on the photoresist film in step 14;

step 16, removing the photoresist film on the front face of the metal substrate, where the photoresist film on the front surface of the metal substrate is removed, to expose a pattern of metal regions to be plated subsequently;

step 17, plating the third metal wiring layer, where the third metal wiring layer is plated on the front face of the metal substrate processed in step 16;

step 18, applying a photoresist film, where the photoresist film for exposing and developing is applied on the front face of the metal substrate processed in step 17;

step 19, removing partially the photoresist film on the front face of the metal substrate, where exposing and developing for patterning are performed, by using the exposing and developing device, on the front face of the metal substrate on which the photoresist film has been applied in step 18, to partially remove and pattern the photoresist film, to expose a pattern of regions on the front face of the metal substrate to be plated subsequently;

step 20, plating a fourth metal wiring layer, where the fourth metal wiring layer, served as electrical conductive pillars for connecting the third metal wiring layer and a fifth metal wiring layer, is plated on the regions on the front face of the metal substrate exposed by partially removing the photoresist film in step 19;

step 21, removing the photoresist films, where the photoresist films on the surfaces of the metal substrate are removed;

step 22, applying a non-electrical conductive adhesive film, where a layer of non-electrical conductive adhesive film is applied on the front face of the metal substrate;

step 23, performing grinding on the surface of the non-electrical conductive adhesive film, where the grinding is performed on the surface of the applied non-electrical conductive adhesive film;

step 24, performing metallization preprocessing on the surface of the non-electrical conductive adhesive film, where the metallization preprocessing is performed on the surface of the non-electrical conductive adhesive film;

step 25, applying photoresist films, where the photoresist films for exposing and developing are applied on the front face and the back face of the metal substrate processed in step 24;

step 26, removing partially the photoresist film on the front face of the metal substrate, where exposing and developing for patterning are performed, by using the exposing and developing device, on the front face of the metal substrate on which the photoresist film has been applied in step 25, to partially remove and pattern the photoresist film, to expose a pattern of regions on the front face of the metal substrate where etching is to be performed subsequently;

step 27, performing etching, where the etching is performed on the regions where windowing has been performed on the photoresist film in step 26;

step 28, removing the photoresist film on the front face of the metal substrate, where the photoresist film on the front surface of the metal substrate is removed;

step 29, plating the fifth metal wiring layer, where the fifth metal wiring layer is plated on the front face of the metal substrate processed in step 28, for forming a pad and pins on the metal substrate;

step 30, applying a photoresist film, where the photoresist film for exposing and developing is applied on the front face of the metal substrate processed in step 29;

step 31, removing partially the photoresist film on the back face of the metal substrate, where exposing and developing for patterning are performed, by using the exposing and developing device, on the back face of the metal substrate on which the photoresist film has been applied in step 30, to partially remove and pattern the photoresist film, to expose a pattern of a region on the back face of the metal substrate where etching is to be performed subsequently;

step 32, performing chemical etching, where the chemical etching is performed on the region on the back face of the metal substrate where exposing and developing have been performed in step 31 up to the metal wiring layer;

step 33, applying a photoresist film, where the photoresist film for exposing and developing is applied on the back face of the metal substrate on which the chemical etching has been performed in step 32;

step 34, removing partially the photoresist film on the back face of the metal substrate, where exposing and developing for patterning are performed, by using the exposing and developing device, on the back face of the metal substrate on which the photoresist film has been applied in step 33, to partially remove and pattern the photoresist film, to expose a pattern of regions on the back face of the metal substrate to be plated subsequently;

step 35, plating metal pillars, where the metal pillars are plated on the regions on the back face of the metal substrate exposed by removing partially the photoresist film in step 34;

step 36, removing the photoresist films, where the photoresist films on the surfaces of the metal substrate are removed;

step 37, installing a chip, where the chip is installed with underfill on the pad and the pins, for which step 36 has been performed, in a flip manner;

step 38, performing encapsulating, where the back face of the metal substrate processed in step 37 is molded with epoxy resin (also known as molding compound);

step 39, performing grinding on the surface of the epoxy resin, where the grinding is performed on the surface of the epoxy resin after epoxy resin molding has been performed in step 38; and step 40, plating an anti-oxidation metal layer or coating antioxidant (OSP), where the anti-oxidation metal layer is plated on exposed metal surfaces of the metal substrate on which step 39 has been performed or antioxidant (OSP) is coated on the exposed metal surfaces.

Steps 6 to 17 may be performed repeatedly, for forming additional metal wiring layers.

Compared with the conventional technology, the present disclosure has the following advantages.

1) Metal lead frame is traditionally manufactured in a mechanical punching way or a chemical etching way, and hence multi metal wiring layers are not available. Meanwhile, no object can be embedded in an interlayer of the metal lead frame manufactured in the punching way. However, an object can be embedded in the interlayer of the three-dimensional composite metal circuit board according to the present disclosure;

2) An object for conducting or dispersing heat can be embedded at a position or inside a region in the interlayer of the three-dimensional composite metal circuit board where heat conduction or heat dissipation is required, thereby realizing a heat performance system-level metal lead frame (with reference to FIG. 81);

3) An active element or component or a passive component can be embedded at a position or inside a region in the interlayer of the three-dimensional composite metal circuit board according to system requirement and function requirement, thereby realizing a system-level metal lead frame;

4) It can not seen from appearance of the finished three-dimensional composite metal circuit board that the object has been embedded in the interlayer according to system requirement and function requirement, especially, an embedded chip made of silicon material which can not be detected even by X-ray, thereby realizing secrecy and protection of the system and function;

5) Various components are contained in the finished three-dimensional composite metal circuit board, in a case that a secondary packaging is not performed subsequently, and as long as the three-dimensional composite metal circuit board is divided into individuals, each of which is an ultra-thin package;

6) In addition to the function of embedding objects, secondary packaging can also be performed on the three-dimensional composite metal circuit board, thereby sufficiently realizing integration for functions of the system;

7) In addition to the function of embedding objects, unit packaging or system-in-packaging can be performed at the peripheral of the package of the three-dimensional composite metal circuit board, thereby sufficiently realizing double-system or multi-system packaging technology; and 8) the three-dimensional metal circuit board can be applied to a multi-chip module (MCM) packaging (with reference to FIG. 82 and FIG. 83), and a base material of the three-dimensional metal circuit board has lower cost and higher toughness as compared to a base material of the traditional MCM substrate.

BRIEF DESCRIPTION OF THE DRAWINGS

It can be believed that the features, advantages and objects of the present disclosure described above can be understood better by the embodiments of the present disclosure described below in conjunction with drawings.

Figure 1:
FIG. 1 to FIG. 22 are schematic diagrams of each procedure of a method for manufacturing a first-etched and later-packaged flip chip three-dimensional system-in-package metal circuit board structure according to the present disclosure.

In the drawings, metal substrate frame 1, pad 2, pin 3, underfill 4, chip 5, metal wire 6, electrical conductive pillar 7, molding compound 8, anti-oxidation layer or coated antioxidant 9, passive device 10, electro-static discharge ring 11, second chip 12, second electrical conductive pillar 13, electrical conductive substance 14, electrical conductive adhesive substance or non-electrical conductive adhesive substance 15.

DETAILED DESCRIPTION

In the following, the technical solution according to the embodiments of the present disclosure will be described in detail in conjunction with the drawings in the embodiments of the present disclosure. It should be understood that the described embodiments are just a part of the embodiments, not all embodiments. Based on the embodiments of the present disclosure, all other embodiments obtained by those skilled in the art without creative work will fall within the protection scope of the present disclosure. The present disclosure provides an first-etched and later-packaged flip chip three-dimensional system-in-package metal circuit board structure and a process method thereof.

First Embodiment: One Wiring Layer, One Flip Chip, and One Pin Ring

Figure 23:
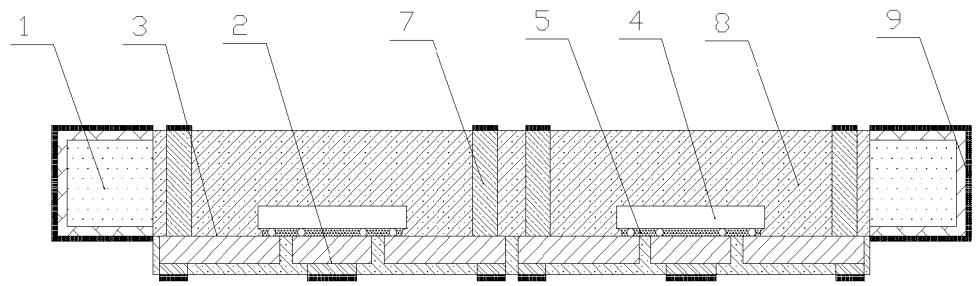
FIG. 23 is a schematic diagram of a first-etched and later-packaged flip chip three-dimensional system-in-package metal circuit board structure according to a first embodiment of the present disclosure.

With reference to FIG. 23, FIG. 23 is a schematic diagram of a first-etched and later-packaged flip chip three-dimensional system-in-package metal circuit board structure according to the first embodiment of the present disclosure, which includes: a metal substrate frame 1; pads 2 and pins 3 disposed inside of the metal substrate frame 1; chips 5 installed on front faces of the pads 2 and the pins 3 by underfill 4 in a flip manner; electrical conductive pillars 7 disposed on front faces of the pins 3; molding compound 8 encapsulated at peripheral regions of the pads 2, regions between the pads 2 and the pins 3, regions between the pins 3, the region above the pads 2 and the pins 3, the region below the pads 2 and the pins 3, and outside of the chips 5 and the electrical conductive pillars 7, where the top of the molding compound 8 flushes with the tops of the electrical conductive pillars 7; and an anti-oxidation layer 9 is plated on or antioxidant (organic solderability preservative, OSP) 9 is coated on surfaces of the metal substrate frame 1, the pads 2, the pins 3 and the electrical conductive pillars 7 exposing out of the molding compound 8.

The process method includes the following steps.

In step 1, a metal substrate is prepared.

With reference to FIG. 1, the metal substrate having a suitable thickness is prepared, as a transitional material for wiring manufacture and subsequent packaging and supporting a wiring layer structure. The material of the substrate includes preferably a metal material. The metal material may include a copper material, an iron material, a galvanized material, a stainless steel material, an aluminum material, or a metallic substance or a nonmetallic substance. Specifically, the metallic substance and the nonmetallic substance have an electrical conductive function.

In step 2, a thin layer of copper is pre-plated on surfaces of the metal substrate.

Figure 2:
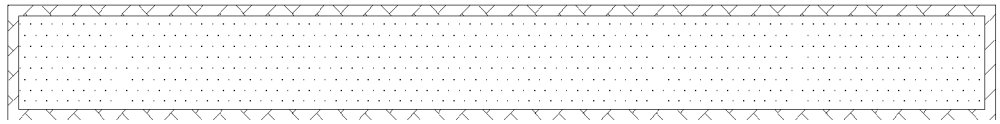

With reference to FIG. 2, the thin layer of copper is pre-plated on the surfaces of the metal substrate, a thickness of the layer ranges from 2 micrometer to 10 micrometer, and can be added or decreased based on function needs, so that the wiring layer and the metal substrate can be jointed tightly together in subsequent wiring manufacture. The plating may include chemical deposition or electrolytic electroplating.

In step 3, photoresist films are applied.

Figure 3:
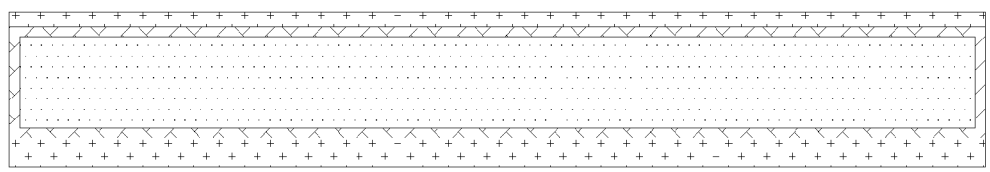

With reference to FIG. 3, photoresist films for exposing and developing are applied on a front face and a back face of the metal substrate on which the thin layer of copper has been pre-plated, respectively, to perform protection function in subsequent process for plating a metal layer. The photoresist films may include dry photoresist films or wet photoresist films.

In step 4, the photoresist film on the back face of the metal substrate is removed partially.

Figure 4:
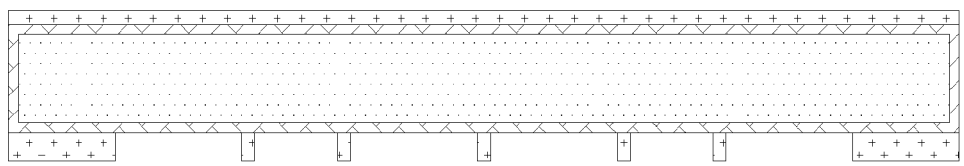

With reference to FIG. 4, exposing and developing for patterning are performed, by using an exposing and developing device, on the back face of the metal substrate on which the photoresist film has been applied in step 3, to partially remove and pattern the photoresist film, to expose a pattern of regions on the back face of the metal substrate to be plated subsequently.

In step 5, a metal wiring layer is plated.

Figure 5:
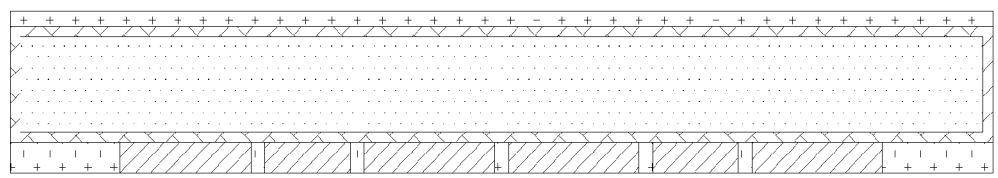

With reference to FIG. 5, the metal wiring layer is plated on the regions on the back face of the metal substrate exposed by partially removing the photoresist film in step 4. The material of the metal wiring layer may include copper, aluminum, nickel, silver, gold, copper-silver, nickel-gold or nickel-palladium-gold and son on (a thickness of the metal wiring layer ranges from 5 micrometer to 20 micrometer, and can be changed based on different characteristics). Other metallic substances having an electrical conductive function may also be used, and it is not limited to the metal material such as copper, aluminum, nickel, silver, gold, copper-silver, nickel-gold or nickel-palladium-gold. The plating may include chemical deposition or electrolytic electroplating.

In step 6, a photoresist film is applied.

Figure 6:
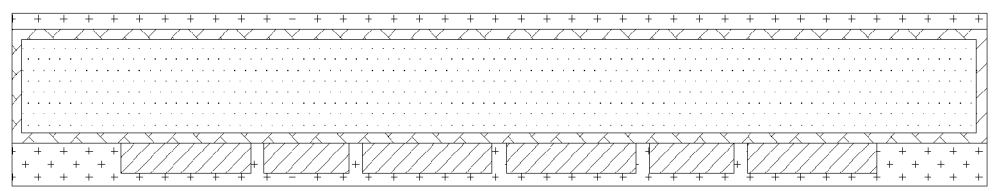

With reference to FIG. 6, the photoresist film for exposing and developing is applied on the back face of the metal substrate processed in step 5, and the photoresist film may include a dry photoresist film or a wet photoresist film.

In step 7, the photoresist film on the back face of the metal substrate is removed partially.

Figure 7:
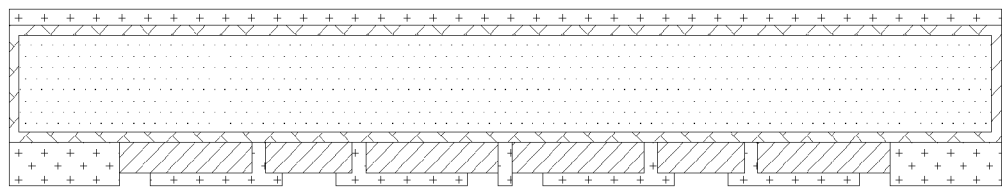

With reference to FIG. 7, exposing and developing for patterning are performed, by using the exposing and developing device, on the back face of the metal substrate on which the photoresist film has been applied in step 6, to partially remove and pattern the photoresist film, to expose a pattern of regions on the back face of the metal substrate to be plated subsequently.

In step 8, a high electrical conductive metal wiring layer is plated.

Figure 8:
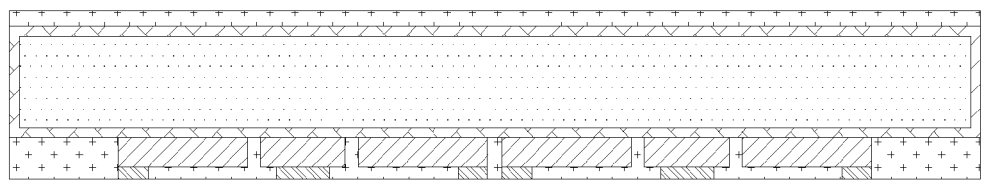

With reference to FIG. 8, the high electrical conductive metal wiring layer is plated on the regions on the back face of the metal substrate exposed by removing partially the photoresist film in step 7. The material of the high electrical conductive metal wiring layer may include copper, aluminum, nickel, silver, gold, copper-silver, nickel-gold or nickel-palladium-gold and so on. Other metallic substances having an electrical conductive function may also be used, and it is not limited to the metal material such as copper, aluminum, nickel, silver, gold, copper-silver, nickel-gold or nickel-palladium-gold. The plating may include chemical deposition or electrolytic electroplating.

In step 9, the photoresist films are removed.

Figure 9:
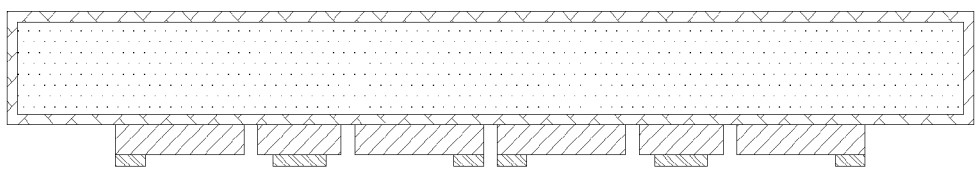

With reference to FIG. 9, the photoresist films on the surfaces of the metal substrate are removed, a method for removing the photoresist films includes: softening by chemical solution and washing by high-pressure water.

In step 10, epoxy resin molding is performed.

Figure 10:
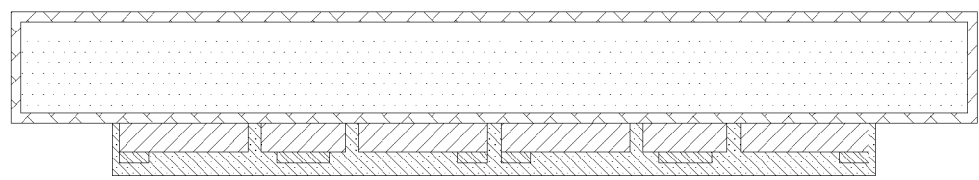

With reference to FIG. 10, the epoxy resin molding for protection function is performed on surfaces of the metal wiring layer and the high electrical conductive metal wiring layer on the back face of the metal substrate. Filler epoxy resin or no-filler epoxy resin can be selected based on product characteristics. The molding way may include: a mold pouring sealant way, a spraying way by a spraying equipment, a film applying way or a brush coating way.

In step 11, grinding is performed on the surface of the epoxy resin.

Figure 11:
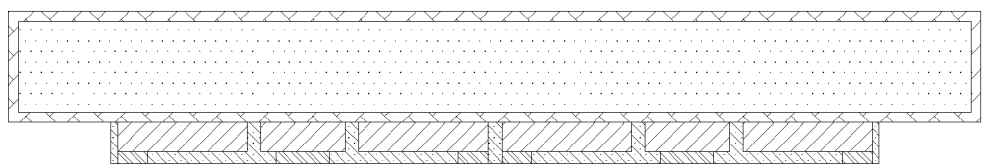

With reference to FIG. 11, grinding is performed on the surface of the epoxy resin after epoxy resin molding is performed, to expose the high electrical conductive metal wiring layer used as an outer lead out of a surface of the molded epoxy resin and control the thickness of the epoxy resin.

In step 12, photoresist films are applied.

Figure 12:
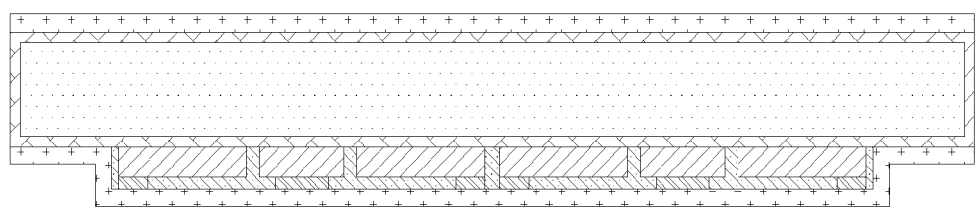

With reference to FIG. 12, the photoresist films for exposing and developing are applied on the front face and the back face of the metal substrate on which step 11 has been performed, the photoresist films may include dry photoresist films or wet photoresist films.

In step 13, the photoresist film on the front face of the metal substrate is removed partially.

Figure 13:
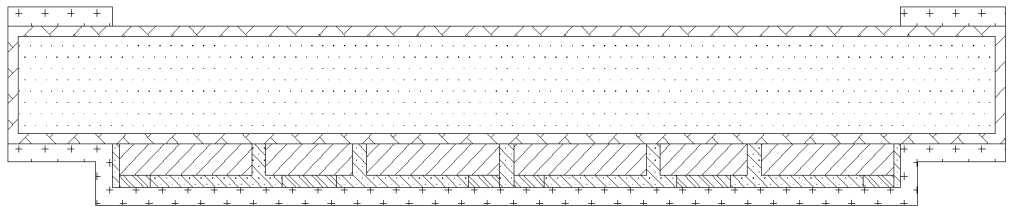

With reference to FIG. 13, exposing and developing for patterning are performed, by using the exposing and developing device, on the front face of the metal substrate on which the photoresist film has been applied in step 12, to partially remove and pattern the photoresist film, to expose a pattern of a region on the front face of the metal substrate where etching is to be performed subsequently.

In step 14, chemical etching is performed.

Figure 14:
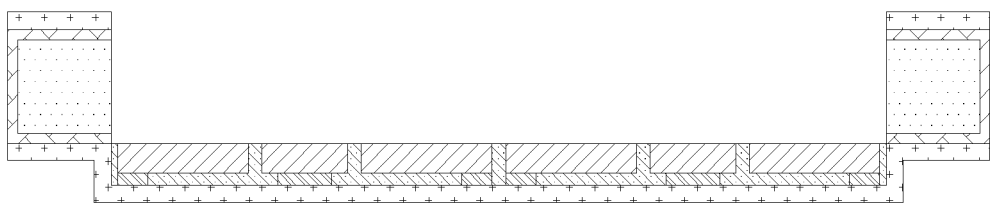

With reference to FIG. 14, chemical etching is performed on the region on the front face of the metal substrate where exposing and developing have been performed in step 13 up to the metal wiring layer, and etching solution may include copper chloride, ferric chloride or any other solution by which the chemical etching may be performed.

In step 15, photoresist films are applied.

Figure 15:
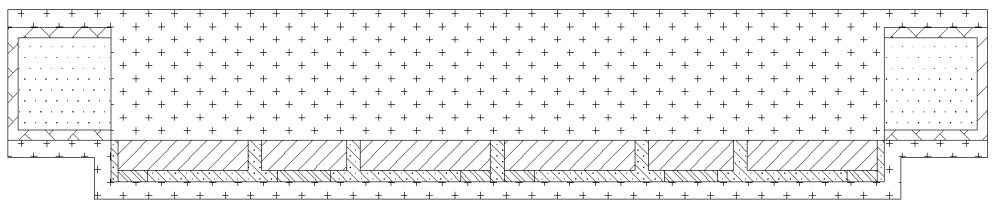

With reference to FIG. 15, the photoresist films for exposing and developing are applied on the front face and the back face of the metal substrate on which step 14 has been performed, the photoresist films may include dry photoresist films or wet photoresist films.

In step 16, the photoresist film on the front face of the metal substrate is removed partially.

Figure 16:
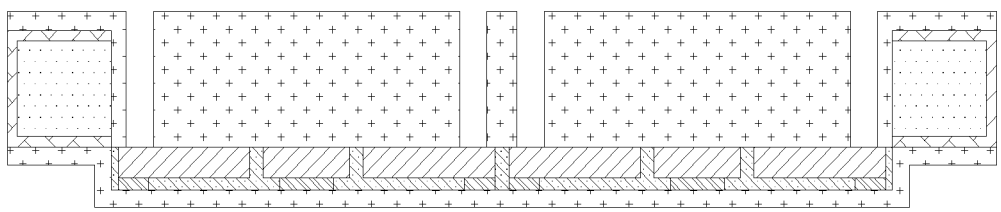

With reference to FIG. 16, exposing and developing for patterning are performed, by using the exposing and developing device, on the front face of the metal substrate on which the photoresist film has been applied in step 15, to partially remove and pattern the photoresist film, to expose a pattern of regions on the front face of the metal substrate to be plated subsequently.

In step 17, metal pillars are plated.

Figure 17:
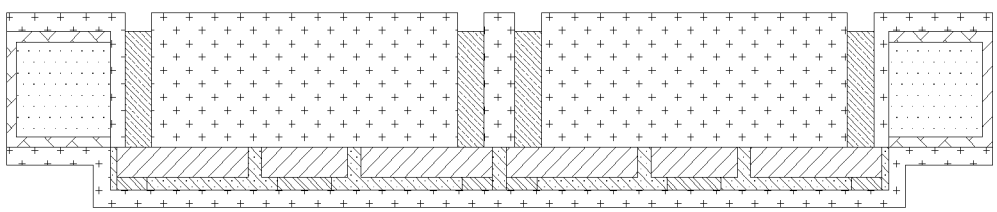

With reference to FIG. 17, the metal pillars are plated on the regions on the front face of the metal substrate exposed by removing partially the photoresist film in step 16. The material of the metal pillars may include copper, aluminum, nickel, silver, gold, copper-silver, nickel-gold or nickel-palladium-gold and so on. Other metallic substance having an electrical conductive function may also be used, and it is not limited to the metal material such as copper, aluminum, nickel, silver, gold, copper-silver, nickel-gold or nickel-palladium-gold. The plating may include chemical deposition or electrolytic electroplating.

In step 18, the photoresist films are removed.

Figure 18:
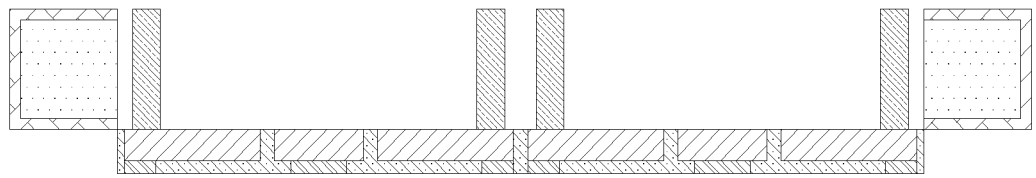

With reference to FIG. 18, the photoresist films on the surface of the metal substrate are removed, a method for removing the photoresist films includes: softening by chemical solution and washing by high-pressure water.

In step 19, chips are installed.

Figure 19:
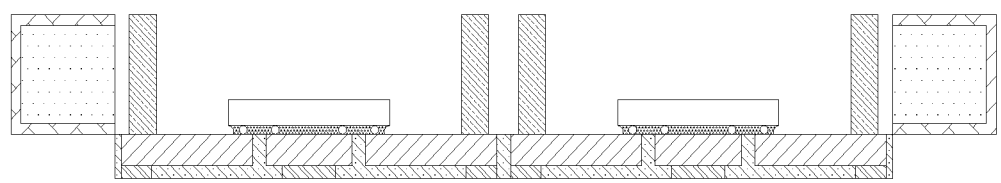

With reference to FIG. 19, the chips are installed on the pads and pins, for which step 18 has been performed, with underfill in a flip manner. The flip manner may include coating the pads and the pins with the underfill and then install the chips in a flip manner, or coating the front faces of the chips with the underfill and then install the chip on front faces of the pads and the pins in a flip manner.

In step 20, encapsulating is performed.

Figure 20:
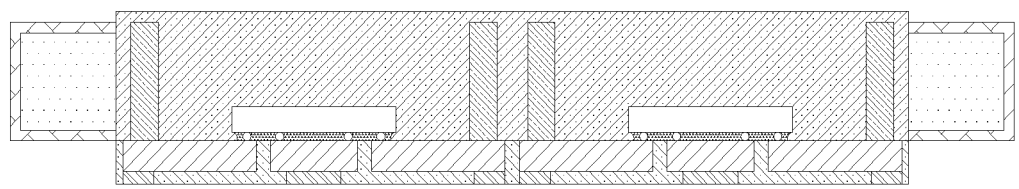

With reference to FIG. 20, the front face of the metal substrate processed in step 19 is molded with molding compound in a mold pouring sealant way, a spraying way by a spraying equipment, or a film applying way. The molding compound may include filler epoxy resin or no-filler epoxy resin.

In step 21, grinding is performed on the surface of the epoxy resin.

Figure 21:
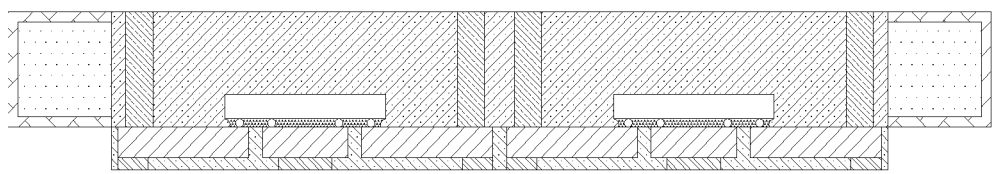

With reference to FIG. 21, grinding is performed on the surface of the epoxy resin after epoxy resin molding has been performed in step 20, to expose the metal pillars out of the surface of the molded epoxy resin and control the thickness of the epoxy resin.

In step 22, an anti-oxidation metal layer is plated or antioxidant (OSP) is coated.

Figure 22:
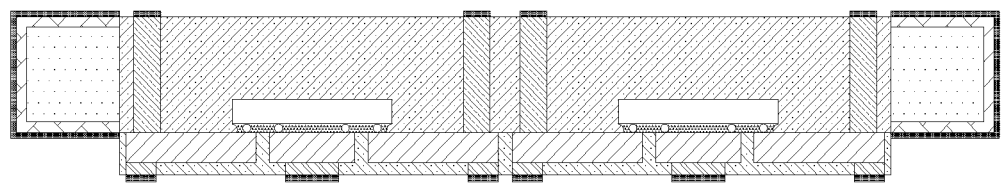

With reference to FIG. 22, the anti-oxidation metal layer, such as gold, nickel-gold, nickel-palladium-gold or tin, is plated on exposed metal surfaces of the metal substrate on which step 21 is performed, to prevent the metal from being oxidized, or antioxidant (OSP) is coated on the exposed metal surfaces.

Figure 24:
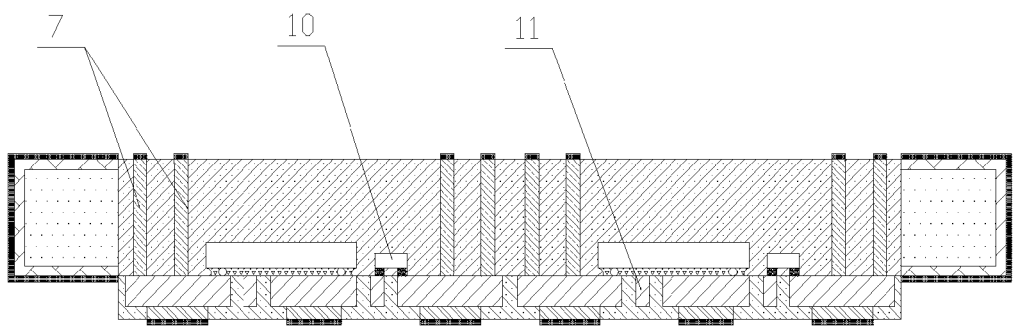
FIG. 24 is a schematic diagram of a first-etched and later-packaged flip chip three-dimensional system-in-package metal circuit board structure according to a second embodiment of the present disclosure.

Second Embodiment: Multiple Rings and One Flip Chip+Passive Device+Electro-Static Discharge Ring With reference to FIG. 24, FIG. 24 is a schematic diagram of a first-etched and later-packaged flip chip three-dimensional system-in-package metal circuit board structure according to a second embodiment of the present disclosure. The second embodiment is different from the first embodiment in that: pins 3 are arranged into multiple rings, a passive device 10 is connected between pins 3 via electrical conductive adhesive substance, an electro-static discharge ring 11 is disposed between a pad 2 and pins 3, and the passive device 10 may be connected between front faces of the pins 3.

Third Embodiment: One Ring, Multiple Pads, Tiling Multiple Flip Chips

Figure 25:
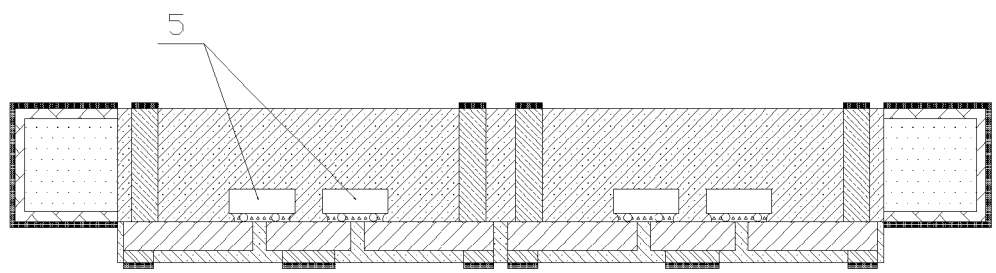
FIG. 25 is a schematic diagram of a first-etched and later-packaged flip chip three-dimensional system-in-package metal circuit board structure according to a third embodiment of the present disclosure.

With reference to FIG. 25, FIG. 25 is a schematic diagram of an first-etched and later-packaged flip chip three-dimensional system-in-package metal circuit board structure according to a third embodiment of the present disclosure. The third embodiment is different from the first embodiment in that: multiple chips 5 are installed on front faces of a pad 2 and pins 3 by underfill 4 in a flip manner.

Fourth Embodiment: One-Ring, Stacking Normal Chip and Flip Chip

Figure 26:
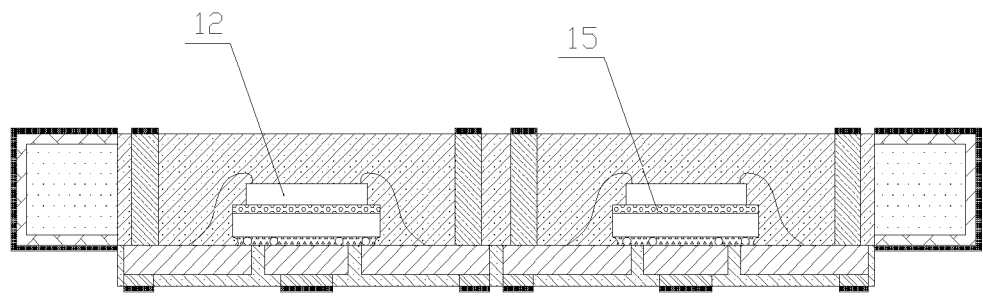
FIG. 26 is a schematic diagram of a first-etched and later-packaged flip chip three-dimensional system-in-package metal circuit board structure according to a fourth embodiment of the present disclosure.

With reference to FIG. 26, FIG. 26 is a schematic diagram of an first-etched and later-packaged flip chip three-dimensional system-in-package metal circuit board structure according to a fourth embodiment of the present disclosure. The fourth embodiment is different from the first embodiment in that: a second chip 12 is disposed on a back face of a chip 5 via electrical conductive adhesive substance or non-conductive adhesive substance 15, and a front face of the second chip 12 is connected to pins 3 by metal wires 6.

Fifth Embodiment: One Ring, Stacking Multiple Flip Chips

Figure 27:
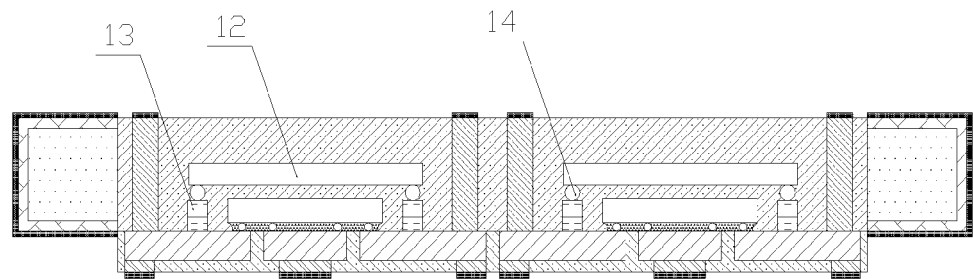
FIG. 27 is a schematic diagram of a first-etched and later-packaged flip chip three-dimensional system-in-package metal circuit board structure according to a fifth embodiment of the present disclosure.

With reference to FIG. 27, FIG. 27 is a schematic diagram of an first-etched and later-packaged flip chip three-dimensional system-in-package metal circuit board structure according to a fifth embodiment of the present disclosure. The fifth embodiment is different from the first embodiment in that: second electrical conductive pillars 13 are disposed on front faces of the pins 3, second chips 12 are installed on the second electrical conductive pillars 13 by an electrical conductive substance 14 in a flip manner, and the second electrical conductive pillars 13 and the second chips 12 are located inside of the molding compound 8.

Sixth Embodiment: No Pad, One Flip Chip

Figure 28:
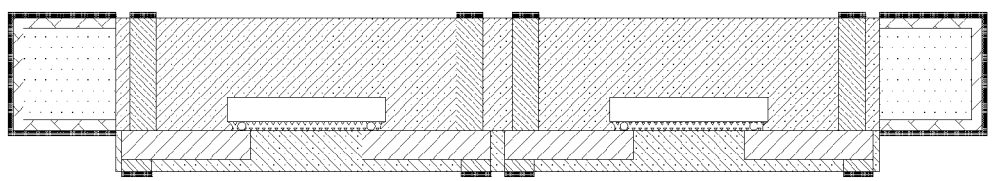
FIG. 28 is a schematic diagram of a first-etched and later-packaged flip chip three-dimensional system-in-package metal circuit board structure according to a sixth embodiment of the present disclosure.

With reference to FIG. 28, FIG. 28 is a schematic diagram of an first-etched and later-packaged flip chip three-dimensional system-in-package metal circuit board structure according to a sixth embodiment of the present disclosure. The sixth embodiment is different from the first embodiment in that, the metal circuit board structure has no pad 2, and the chip 5 is installed between front faces of the pins 3 by underfill 4 in a flip manner.

Seventh Embodiment: Multi Wiring Layers, One Flip Chip, One Pin Ring

Figure 69:
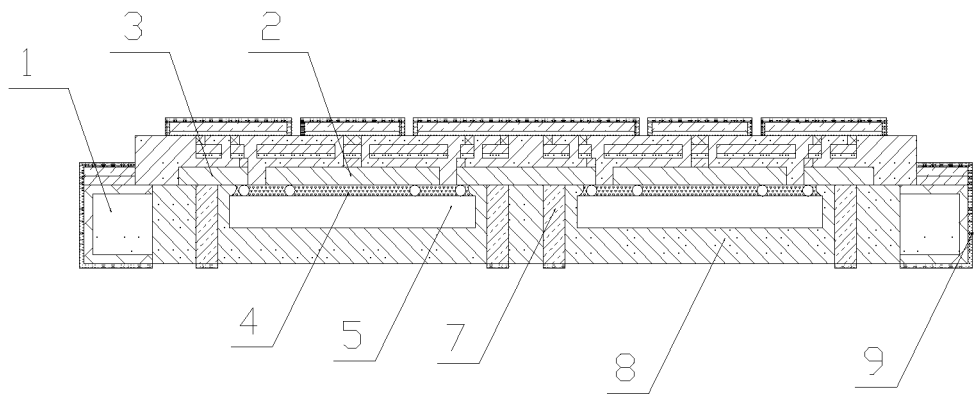
FIG. 69 is a schematic diagram of a first-etched and later-packaged flip chip three-dimensional system-in-package metal circuit board structure according to a seventh embodiment of the present disclosure.
Figure 70:
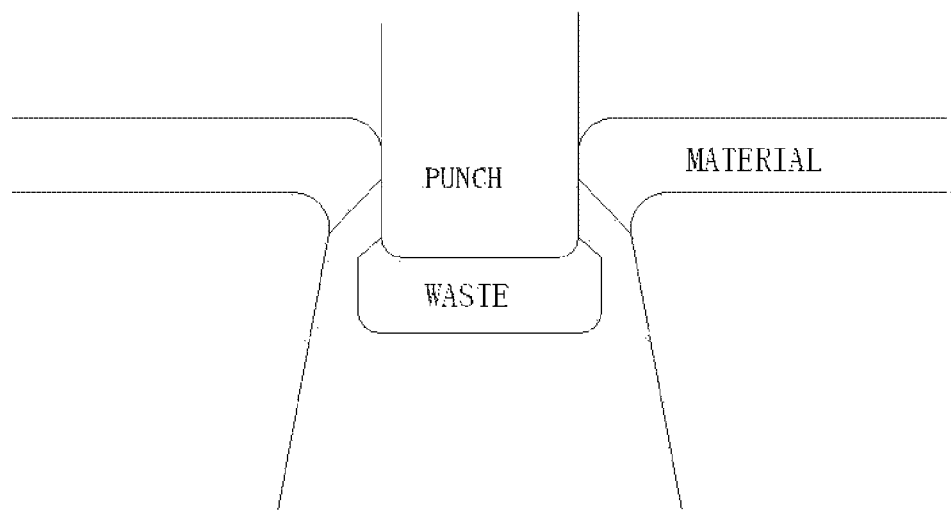
FIG. 70 is a schematic diagram illustrating the punching process in a typical method for manufacturing a traditional metal lead frame.
Figure 71:
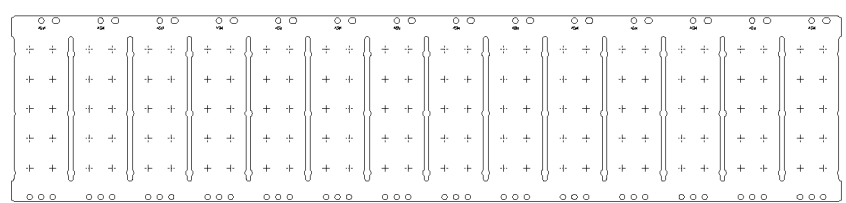
FIG. 71 is a schematic diagram of a bar-shaped metal sheet used in a typical method for manufacturing a traditional metal lead frame.
Figure 72:
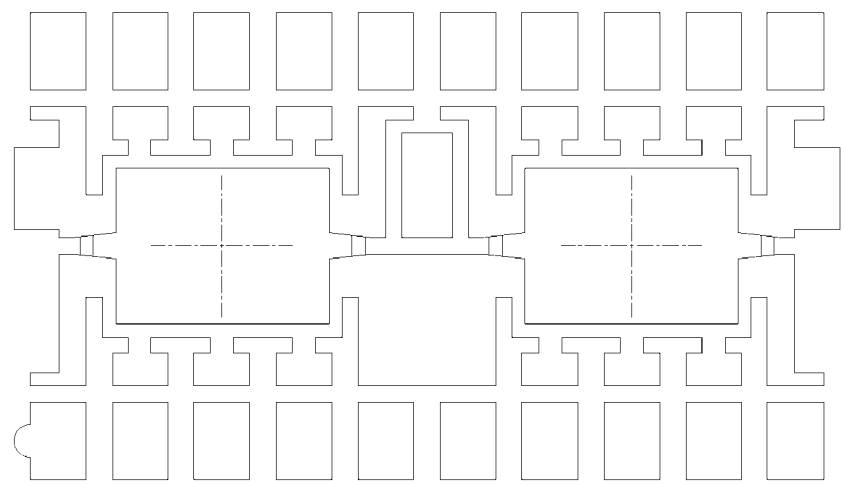
FIG. 72 is a schematic diagram of a front side of a lead frame produced in a typical method for manufacturing a traditional metal lead frame.
Figure 73:
FIG. 73 is schematic diagram of a cross section of a traditional metal lead frame after typical processes, such as exposing, developing, windowing and etching, have been performed.
Figure 74:
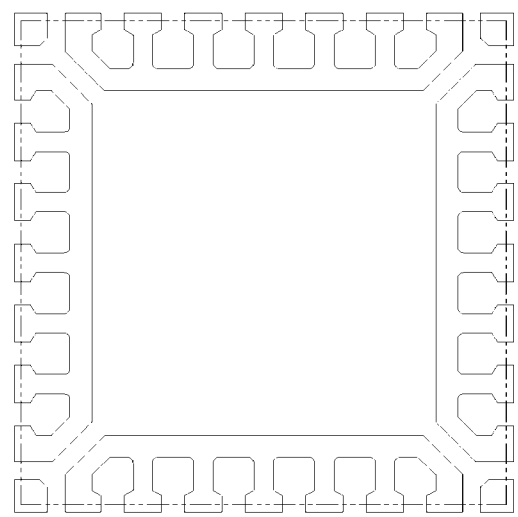
FIG. 74 is a schematic diagram of a front side of a lead frame produced in a typical method for manufacturing a traditional metal lead frame.
Figure 75:
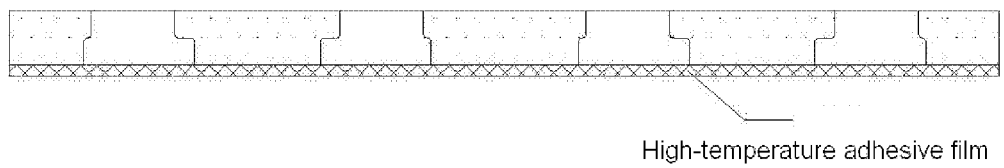
FIG. 75 is a schematic diagram of a cross section of QFN produced in a typical method for manufacturing a traditional metal lead frame.
Figure 76:
FIG. 76 is a schematic diagram of a pre-filler lead frame produced in a typical method for manufacturing a traditional metal lead frame.
Figure 77:
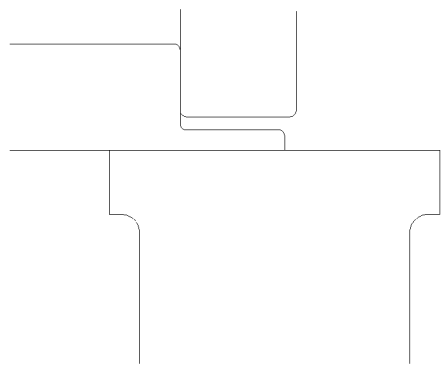
FIG. 77 is a schematic diagram illustrating an extended metal region formed by pressing with the upper and lower tool in a typical method for manufacturing a traditional metal lead frame.
Figure 78:
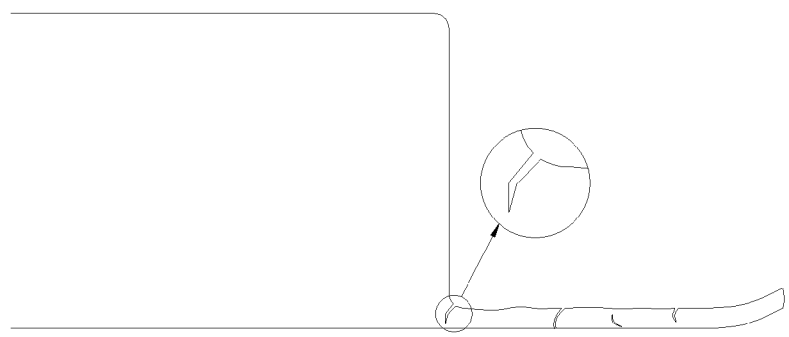
FIG. 78 is a schematic diagram illustrating crack, warp and break in the extended metal region formed by pressing with the upper and lower tool in a typical method for manufacturing a traditional metal lead frame.
Figure 79:
FIG. 79 is a schematic diagram of an extended metal region formed by pressing with the upper and lower tool in a typical method for manufacturing a traditional metal lead frame, which has a length less than 80 percent of a thickness of the lead frame.
Figure 80:
FIG. 80 is a schematic diagram of an extended metal region formed by pressing with the upper and lower tool in a typical method for manufacturing a traditional metal lead frame, which has a length less than 80 percent of a thickness of the lead frame, with difficulty in embedding an object.
Figure 81:
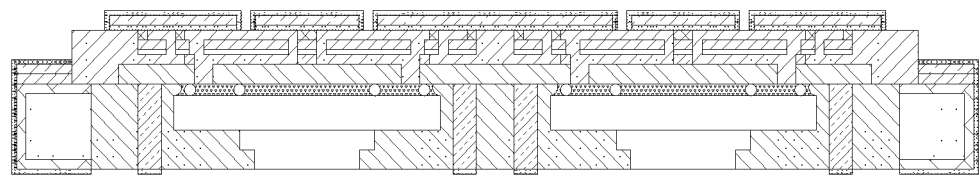
FIG. 81 is a schematic diagram showing that an object for conducting or dispersing heat is embedded at a position or inside a region in the interlayer of the three-dimensional composite metal circuit board where heat conduction or heat dissipation is required.
Figure 82:
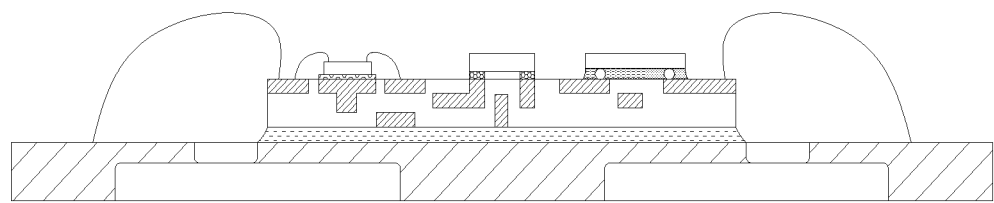
FIG. 82 is a schematic diagram showing that the three-dimensional metal circuit board is applied to a multi-chip module (MCM) package.
Figure 83:
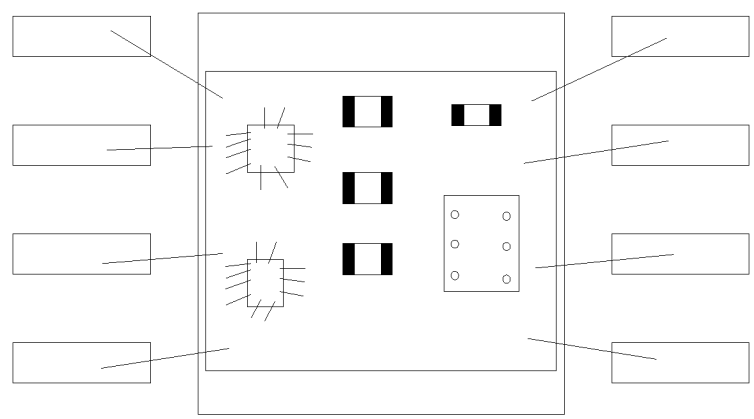
FIG. 83 is a plan view of FIG. 82.

With reference to FIG. 69, FIG. 69 is a schematic diagram of an first-etched and later-packaged flip chip three-dimensional system-in-package metal circuit board structure according to a seventh embodiment of the present disclosure. The seventh embodiment is different from the first embodiment in that: the pads 2 or the pins 3 include multiple metal wiring layers, two adjacent metal wiring layers are connected by electrical conductive pillars, chips 5 are installed between back faces of the pads 2 and the pins 3 by underfill 4 in a flip manner, and electrical conductive pillars 7 are disposed on back faces of the pins 3.

The process method includes the following steps.

In step 1, a metal substrate is prepared.

Figure 29:
FIG. 29 to FIG. 68 are flowcharts of a method for manufacturing a first-etched and later-packaged flip chip three-dimensional system-in-package metal circuit board structure according to a seventh embodiment of the present disclosure.

With reference to FIG. 29, the metal substrate having a suitable thickness is prepared, as a transitional material for wiring manufacture and subsequent packaging and supporting a wiring layer structure. The material of the substrate includes preferably a metal material. The metal may include a copper material, an iron material, a galvanized material, a stainless steel material, an aluminum material, or a metallic substance or a nonmetallic substance. Specifically, the metallic substance and the nonmetallic substance have an electrical conductive function.

In step 2, a thin layer of copper is pre-plated on surfaces of the metal substrate.

Figure 30:

With reference to FIG. 30, the thin layer of copper is pre-plated on the surface of the metal substrate, a thickness of the layer ranges from 2 micrometer to 10 micrometer, and can be added or decreased based on function needs, so that the wiring layer and the metal substrate can be jointed tightly in subsequent wiring manufacture. The plating may include chemical deposition or electrolytic electroplating.

In step 3, photoresist films are applied.

Figure 31:
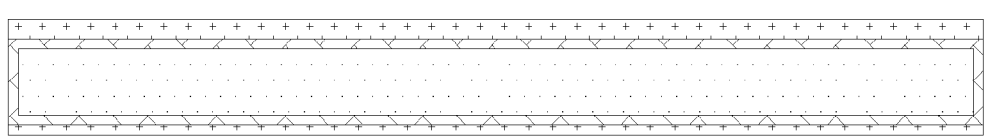

With reference to FIG. 31, photoresist films for exposing and developing are applied on a front face and a back face of the metal substrate on which the thin layer of copper has been pre-plated, respectively, to perform protection function in subsequent process for plating a metal layer. The photoresist films may include dry photoresist films or wet photoresist films.

In step 4, the photoresist film on the front face of the metal substrate is removed partially.

Figure 32:
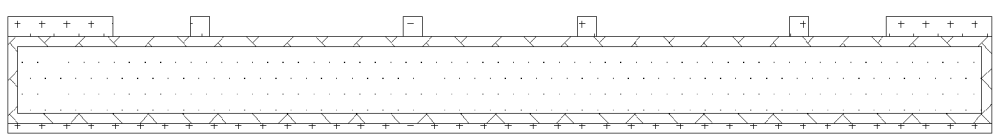

With reference to FIG. 32, exposing and developing for patterning are performed, by using an exposing and developing device, on the front face of the metal substrate on which the photoresist film has been applied in step 3, to partially remove and pattern the photoresist film, to expose a pattern of regions on the front face of the metal substrate to be plated subsequently.

In step 5, a first metal wiring layer is plated.

Figure 33:
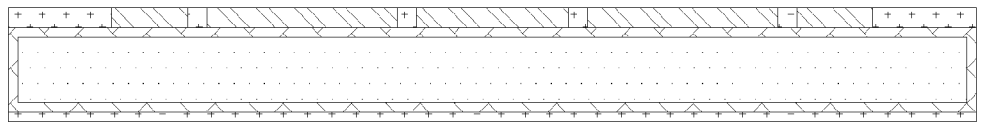

With reference to FIG. 33, the first metal wiring layer is plated on the regions on the front face of the metal substrate exposed by partially removing the photoresist film in step 4. The material of the first metal wiring layer may include copper, aluminum, nickel, silver, gold, copper-silver, nickel-gold or nickel-palladium-gold and son on (a thickness of the first metal wiring layer ranges from 5 micrometer to 20 micrometer, and can be changed based on different characteristics). Other metallic substances having an electrical conductive function may also be used, and it is not limited to metal material such as copper, aluminum, nickel, silver, gold, copper-silver, nickel-gold or nickel-palladium-gold. The plating may include chemical deposition or electrolytic electroplating.

In step 6, a photoresist film is applied.

Figure 34:
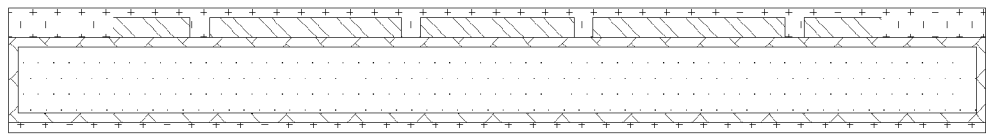

With reference to FIG. 34, the photoresist film for exposing and developing is applied on the front face of the metal substrate processed in step 5. The photoresist film may be a dry photoresist film or a wet photoresist film.

In step 7, the photoresist film on the front face of the metal substrate is removed partially.

Figure 35:
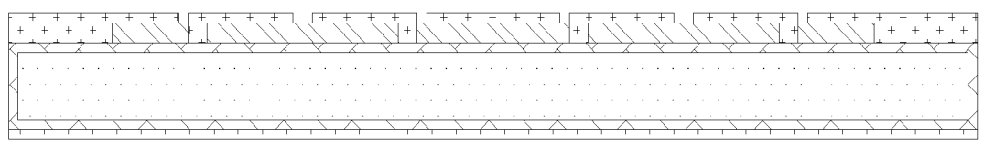

With reference to FIG. 35, exposing and developing for patterning are performed, by using the exposing and developing device, on the front face of the metal substrate on which the photoresist film has been applied in step 6, to partially remove and pattern the photoresist film, to expose a pattern of regions on the front face of the metal substrate to be plated subsequently.

In step 8, a second metal wiring layer is plated.

Figure 36:
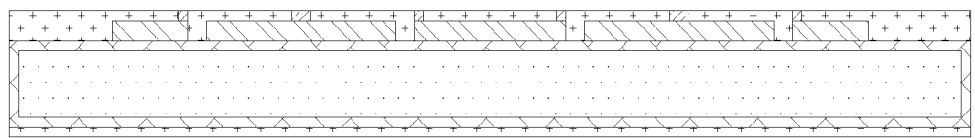

With reference to FIG. 36, the second metal wiring layer, served as electrical conductive pillars for connecting the first metal wiring layer and a third metal wiring layer, is plated on the regions on the front face of the metal substrate exposed by partially removing the photoresist film in step 7. The material of the second metal wiring layer may include copper, nickel-gold, nickel-palladium-gold silver, gold or tin metal, and the plating may include chemical deposition or electrolytic electroplating.

In step 9, the photoresist films are removed.

Figure 37:
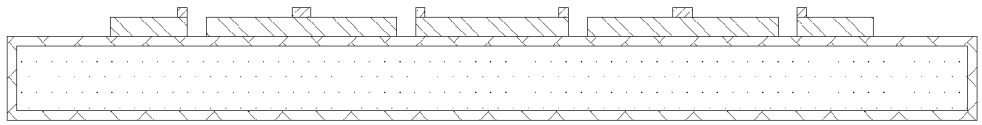

With reference to FIG. 37, the photoresist films on the surfaces of the metal substrate are removed, for subsequent processing of a non-electrical conductive adhesive film, and a method for removing the photoresist films includes: softening by chemical solution and washing by high-pressure water.

In step 10, the non-electrical conductive adhesive film is applied.

Figure 38:
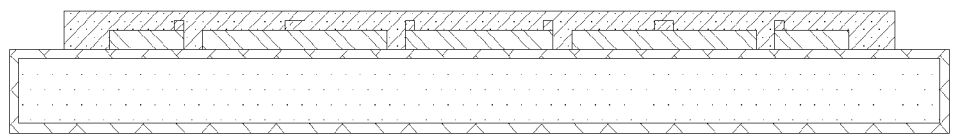

With reference to FIG. 38, a layer of non-electrical conductive adhesive film is applied on the front face (where the wiring layer is provided) of the metal substrate, to insulate the first metal wiring layer from the third metal wiring layer. The non-electrical conductive adhesive film may be applied by using a conventional rolling machine or be applied under vacuum environment, to prevent air from being trapped in the applying process. The non-electrical conductive adhesive film includes preferably thermosetting epoxy resin. The epoxy resin may form a filler non-electrical conductive adhesive film or a no-filler non-electrical conductive adhesive film based on product characteristics, and dyeing processing may be performed on the epoxy resin based on product characteristics.

In step 11, grinding is performed on a surface of the non-electrical conductive adhesive film.

Figure 39:
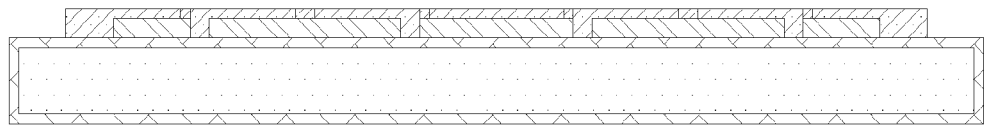

With reference to FIG. 39, grinding is performed on the surface of the applied non-electrical conductive adhesive film, to expose the second metal wiring layer, maintain flatness of the non-electrical conductive adhesive film and the second metal wiring layer, and control the thickness of the non-electrical conductive adhesive film.

In step 12, metallization preprocessing is performed on the surface of the non-electrical conductive adhesive film.

Figure 40:
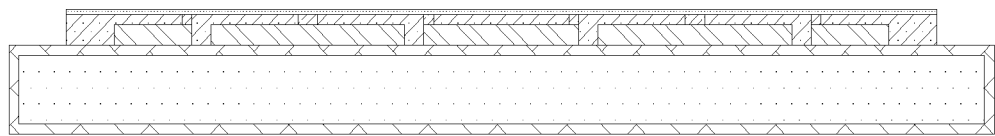

With reference to FIG. 40, the metallization preprocessing is performed on the surface of the non-electrical conductive adhesive film, to attach a layer of metallization polymer material onto the surface thereof, serving as transitional contact agent on which a metal material will be plated subsequently. The metallization polymer material can be attached in a way of spraying, plasma oscillation or surface roughening followed by drying.

In step 13, photoresist films are applied.

Figure 41:
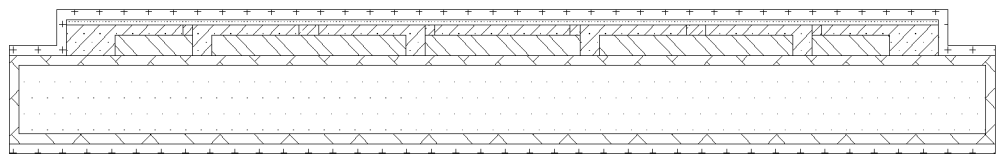

With reference to FIG. 41, photoresist films for exposing and developing are applied on the front face and the back face of the metal substrate processed in step 12, to perform protection function during plating the third metal wiring layer subsequently. The photoresist films may include dry photoresist films or wet photoresist films.

In step 14, the photoresist film on the front face of the metal substrate is removed partially.

Figure 42:
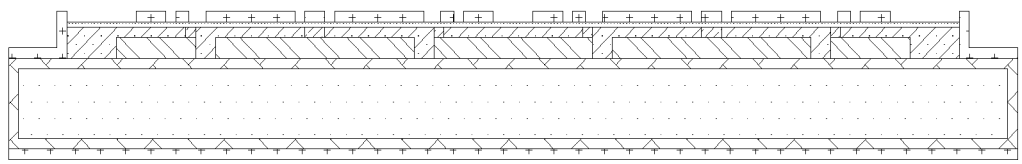

With reference to FIG. 42, exposing and developing for patterning are performed, by using the exposing and developing device, on the front face of the metal substrate on which the photoresist film has been applied in step 13, to partially remove and pattern the photoresist film, to expose a pattern of regions on the front face of the metal substrate where etching is to be performed subsequently.

In step 15, etching is performed.

Figure 43:
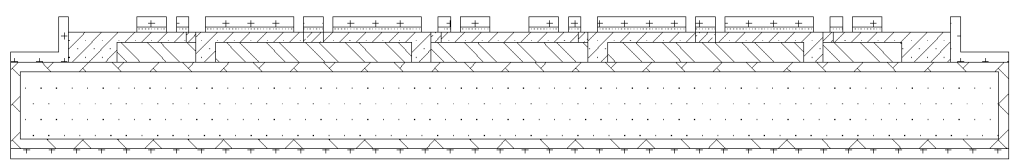

With reference to FIG. 43, etching is performed on the regions where windowing has been performed on the photoresist film in step 14, for eroding metal regions other than the metal wiring to be retained, and the method for the etching may include a process using copper chloride, ferric chloride or any solution which may be used for the chemical etching.

In step 16, the photoresist film on the front surface of the metal substrate is removed.

Figure 44:
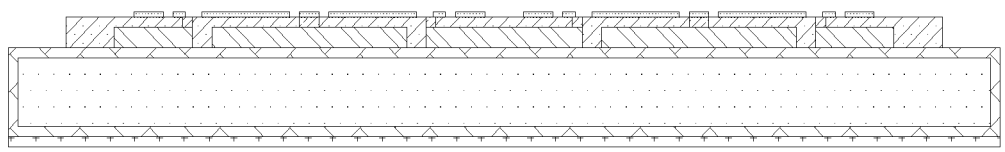

With reference to FIG. 44, the photoresist film on the front face of the metal substrate is removed, to expose a pattern of metal regions to be plated subsequently.

In step 17, the third metal wiring layer is plated.

Figure 45:
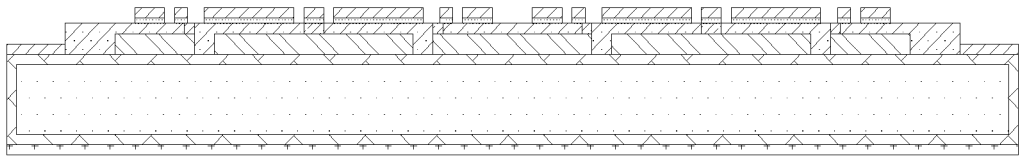

With reference to FIG. 45, the third metal wiring layer is plated on the front face of the metal substrate processed in step 16. The material of the third metal wiring layer may include copper, nickel-gold, nickel-palladium-gold, silver, gold or tin metal. And the plating way include chemical deposition and electrolytic electroplating, or include only the chemical deposition up to a required thickness.

In step 18, a photoresist film is applied.

Figure 46:
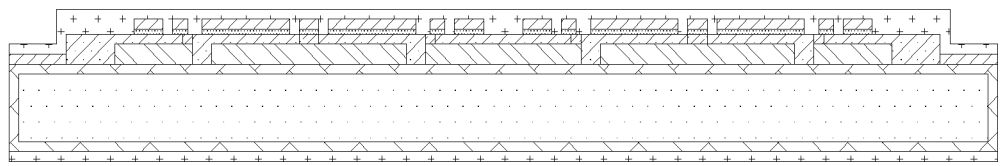

With reference to FIG. 46, the photoresist film for exposing and developing is applied on the front face of the metal substrate processed in step 17, for manufacturing a metal wiring layer subsequently, and the photoresist film may be a dry photoresist film or a wet photoresist film.

In step 19, the photoresist film on the front face of the metal substrate is removed partially.

Figure 47:
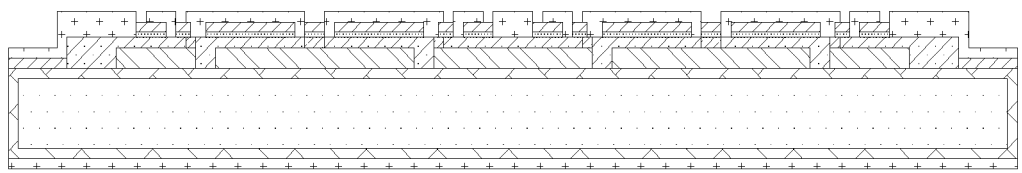

With reference to FIG. 47, exposing and developing for patterning are performed, by using the exposing and developing device, on the front face of the metal substrate on which the photoresist film has been applied in step 18, to partially remove and pattern the photoresist film, to expose a pattern of regions on the front face of the metal substrate to be plated subsequently.

In step 20, a fourth metal wiring layer is plated.

Figure 48:
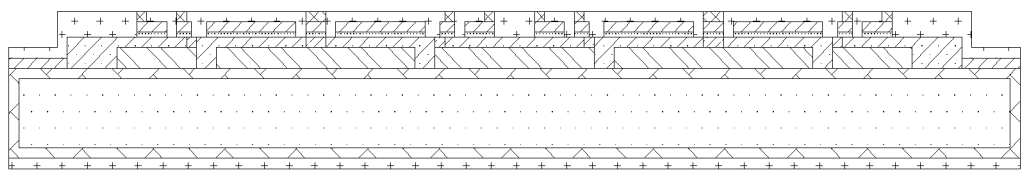

With reference to FIG. 48, the fourth metal wiring layer, served as electrical conductive pillars for connecting the third metal wiring layer and a fifth metal wiring layer, is plated on the regions on the front face of the metal substrate exposed by partially removing the photoresist film in step 19. The material of the metal wiring layer may include copper, nickel-gold, nickel-palladium-gold, silver, gold or tin metal, and the plating may include chemical deposition or electrolytic electroplating.

In step 21, the photoresist films are removed.

Figure 49:
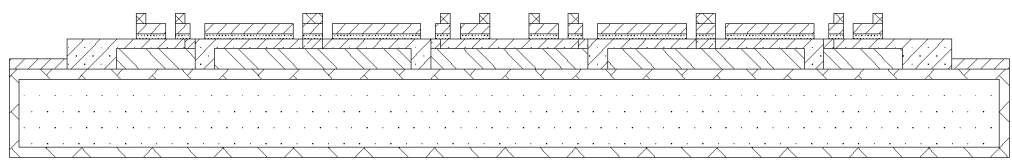

With reference to FIG. 49, the photoresist films on the surfaces of the metal substrate are removed, for subsequent processing of a non-electrical conductive adhesive film, and a method for removing the photoresist films includes: softening by chemical solution and washing by high-pressure water.

In step 22, the non-electrical conductive adhesive film is applied.

Figure 50:
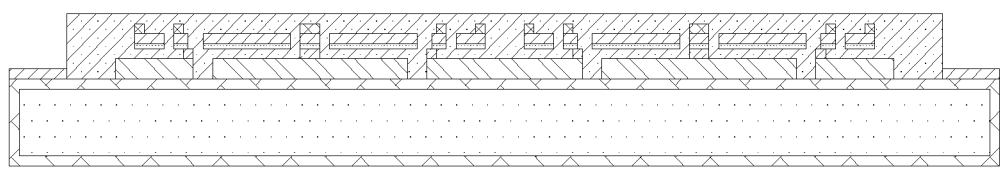

With reference to FIG. 50, a layer of non-electrical conductive adhesive film is applied on the front face (where the wiring layer is provided) of the metal substrate, to insulate the third metal wiring layer from the fifth metal wiring layer. The non-electrical conductive adhesive film may be applied by using a conventional rolling machine or be applied under vacuum environment, to prevent air from being trapped in the applying process. The non-electrical conductive adhesive film includes preferably thermosetting epoxy resin. The epoxy resin may form a filler non-electrical conductive adhesive film or a no-filler non-electrical conductive adhesive film based on product characteristics, and dyeing processing may be performed on the epoxy resin based on product characteristics.

In step 23, grinding is performed on the surface of the non-electrical conductive adhesive film.

Figure 51:
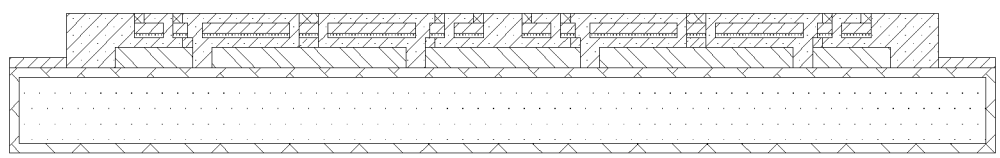

With reference to FIG. 51, grinding is performed on the surface of the applied non-electrical conductive adhesive film, to expose the fourth metal wiring layer, maintain flatness of the non-electrical conductive adhesive film and the fourth metal wiring layer, and control the thickness of the non-electrical conductive adhesive film.

In step 24, metallization preprocessing is performed on the surface of the non-electrical conductive adhesive film.

Figure 52:
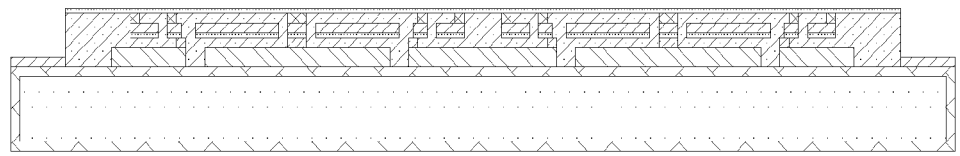

With reference to FIG. 52, the metallization preprocessing is performed on the surface of the non-electrical conductive adhesive film, to attach a layer of metallization polymer material onto the surface thereof, serving as transitional contact agent on which a metal material will be plated subsequently. The metallization polymer material can be attached in a way of spraying, plasma oscillation, or surface roughening followed by drying.

In step 25, photoresist films are applied.

Figure 53:
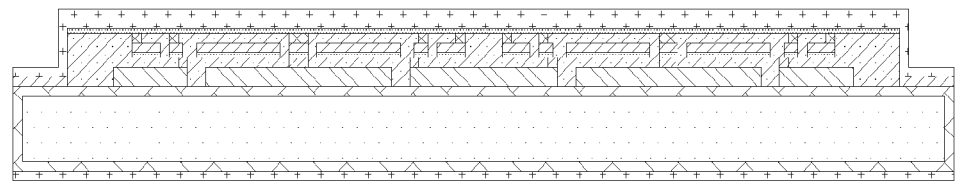

With reference to FIG. 53, photoresist films for exposing and developing are applied on the front face and the back face of the metal substrate processed in step 24, to perform protection function during plating the fifth metal wiring layer subsequently. The photoresist films may include dry photoresist films or wet photoresist films.

In step 26, the photoresist film on the front face of the metal substrate is removed partially.

Figure 54:
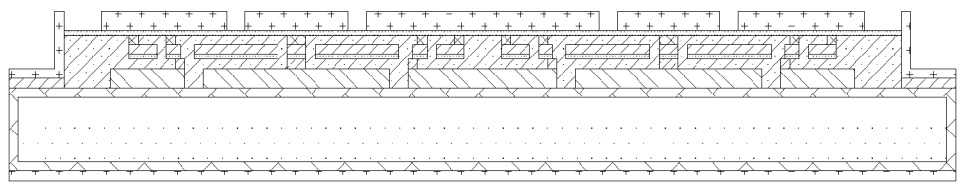

With reference to FIG. 54, exposing and developing for patterning are performed, by using the exposing and developing device, on the front face of the metal substrate on which the photoresist film has been applied in step 25, to partially remove and pattern the photoresist film, to expose a pattern of regions on the front face of the metal substrate where etching is to be performed subsequently.

In step 27, etching is performed.

Figure 55:
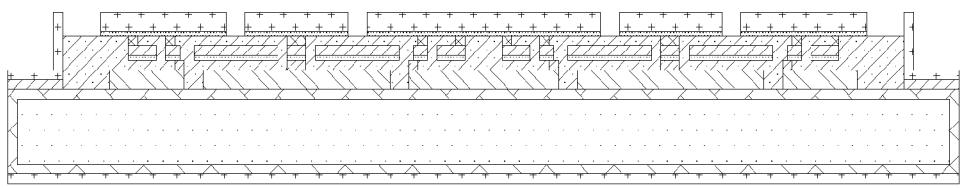

With reference to FIG. 55, etching is performed on the regions where windowing has been performed on the photoresist film in step 26, for eroding metal regions other than the metal wiring to be retained, and the method for the etching may include a process using copper chloride or ferric chloride or any solution which may be used for the chemical etching.

In step 28, the photoresist film on the front surface of the metal substrate is removed.

Figure 56:
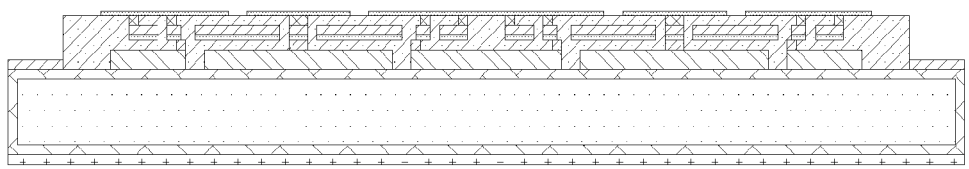

With reference to FIG. 56, the photoresist film on the front face of the metal substrate is removed, to expose pattern of metal regions to be plated subsequently.

In step 29, the fifth metal wiring layer is plated.

Figure 57:
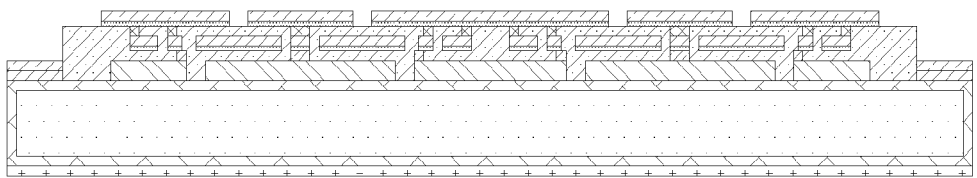

With reference to FIG. 57, the fifth metal wiring layer is plated on the front face of the metal substrate processed in step 28, for forming pads and pins on the metal substrate. The material of the fifth metal wiring layer may include copper, nickel-gold, nickel-palladium-gold, silver, gold, or tin metal. And the plating may include electrolytic electroplating and chemical deposition, or include only the chemical deposition up to a required thickness.

In step 30, a photoresist film is applied.

Figure 58:
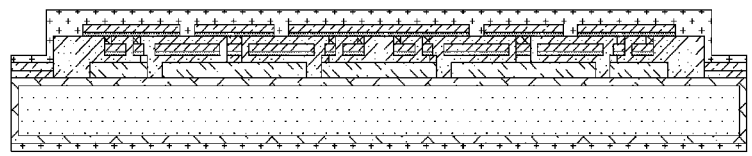

With reference to FIG. 58, the photoresist film for exposing and developing is applied on the front face of the metal substrate processed in step 29, and the photoresist film may be a dry photoresist film or a wet photoresist film.

In step 31, the photoresist film on the back face of the metal substrate is removed partially.

Figure 59:
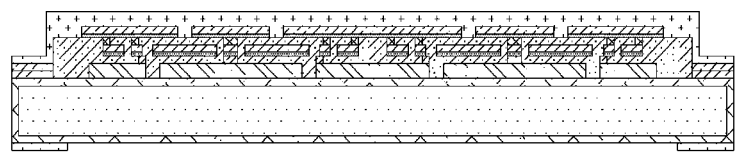

With reference to FIG. 59, exposing and developing for patterning are performed, by using an exposing and developing device, on the back face of the metal substrate on which the photoresist film has been applied in step 30, to partially remove and pattern the photoresist film, to expose a pattern of a region on the back face of the metal substrate where etching is to be performed subsequently.

In step 32, chemical etching is performed.

Figure 60:
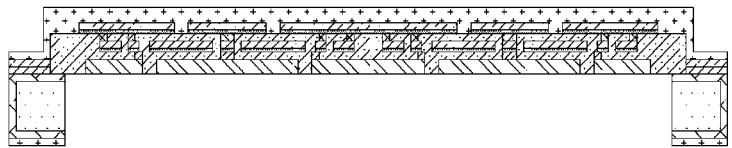

With reference to FIG. 60, chemical etching is performed on the region on the back face of the metal substrate where exposing and developing have been performed in step 31, up to the metal wiring layer, and etching solution may include copper chloride or ferric chloride or any solution which may be used for the chemical etching.

In step 33, a photoresist film is applied.

Figure 61:
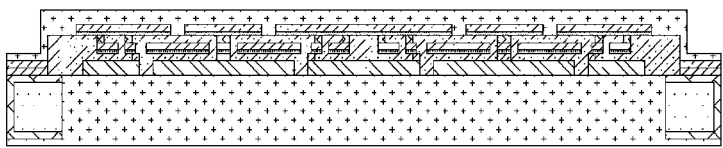

With reference to FIG. 61, the photoresist film for exposing and developing is applied on the back face of the metal substrate on which the chemical etching has been performed in step 32, and the photoresist film may include a dry photoresist film or a wet photoresist film.

In step 34, the photoresist film on the back face of the metal substrate is removed partially.

Figure 62:
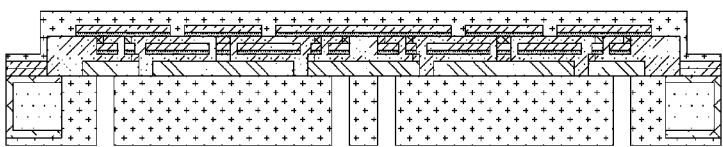

With reference to FIG. 62, exposing and developing for patterning are performed, by using the exposing and developing device, on the back face of the metal substrate on which the photoresist film has been applied in step 33, to partially remove and pattern the photoresist film, to expose a pattern of regions on the back face of the metal substrate to be plated subsequently.

In step 35, metal pillars are plated.

Figure 63:
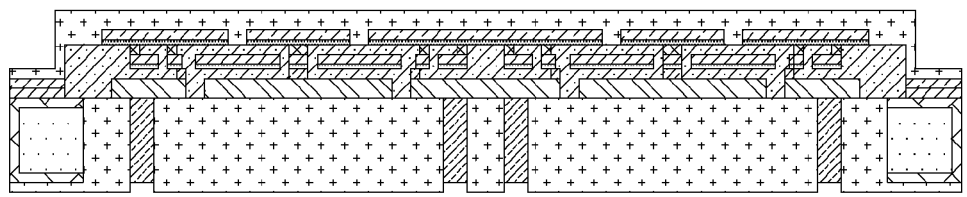

With reference to FIG. 63, the metal pillars are plated on the regions on the back face of the metal substrate exposed by removing partially the photoresist film in step 34. A material of the metal pillars may include copper, aluminum, nickel, silver, gold, copper-silver, nickel-gold or nickel-palladium-gold and so on. Other electrical conductive metallic substance may also be used, and it is not limited to the metal material such as copper, aluminum, nickel, silver, gold, copper-silver, nickel-gold or nickel-palladium-gold. The plating may include chemical deposition or electrolytic electroplating.

In step 36, the photoresist films are removed.

Figure 64:
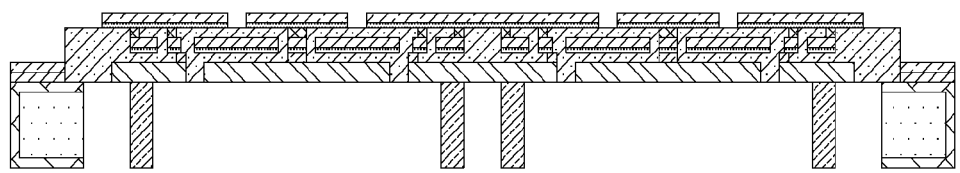

With reference to FIG. 64, the photoresist films on the surfaces of the metal substrate are removed, and a method for removing the photoresist films includes: softening by chemical solution and washing by high-pressure water.

In step 37, chips are installed.

Figure 65:
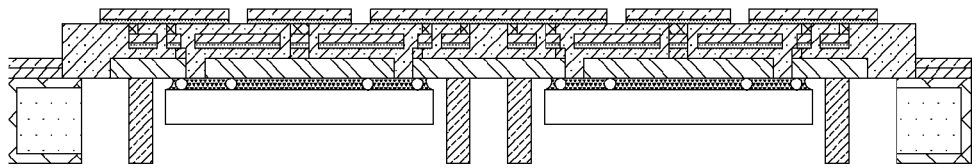

With reference to FIG. 65, the chips are installed on the back faces of the pad and the pins, for which step 36 has been performed, with underfill in a flip manner.

In step 38, encapsulating is performed.

Figure 66:
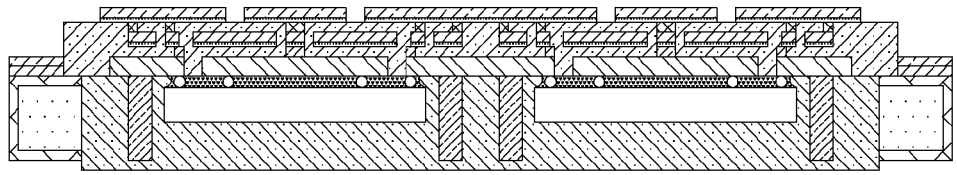

With reference to FIG. 66, the back face of the metal substrate processed in step 37 is molded with molding compound in a mold pouring sealant way, a spraying way by a spraying equipment, a film applying way or a brush coating way. The molding compound may include filler epoxy resin or no-filler epoxy resin.

In step 39, grinding is performed on the surface of the epoxy resin.

Figure 67:
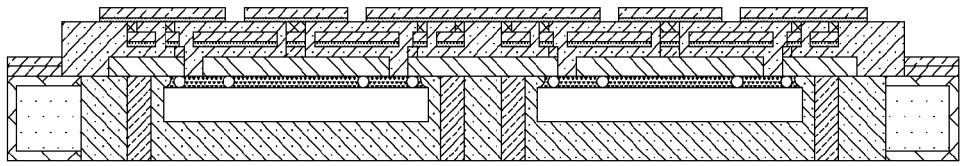

With reference to FIG. 67, grinding is performed on the surface of the epoxy resin after epoxy resin molding has been performed in step 40, to expose the metal pillars out of the surface of the molded epoxy resin and control the thickness of the epoxy resin.

In step 40, an anti-oxidation metal layer is plated or antioxidant (OSP) is coated.

Figure 68:
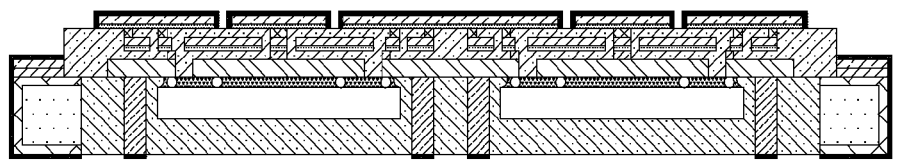

With reference to FIG. 68, the anti-oxidation metal layer, such as gold, nickel-gold, nickel-palladium-gold or tin, is plated on the exposed metal surfaces of the metal substrate on which step 41 is performed, to prevent the metal from being oxidized, or antioxidant (OSP) is coated on the exposed metal surfaces.

What is claimed is:

1. A method for manufacturing a first-etched and later-packaged flip chip three-dimensional system-in-package metal circuit board, comprising:

step 1, preparing a metal substrate;

step 2, pre-plating a thin layer of copper on surfaces of the metal substrate;

step 3, applying photoresist films, wherein the photoresist films for exposing and developing are applied on a front face and a back face of the metal substrate on which the thin layer of copper has been pre-plated, respectively;

step 4, removing partially the photoresist film on the back face of the metal substrate, wherein exposing and developing for patterning are performed, by using an exposing and developing device, on the back face of the metal substrate on which the photoresist film has been applied in step 3, to partially remove and pattern the photoresist film, to expose a pattern of regions on the back face of the metal substrate to be plated subsequently;

step 5, plating a metal wiring layer, wherein the metal wiring layer is plated on the regions on the back face of the metal substrate exposed by partially removing the photoresist film in step 4;

step 6, applying a photoresist film, wherein the photoresist film for exposing and developing is applied on the back face of the metal substrate processed in step 5;

step 7, removing partially the photoresist film on the back face of the metal substrate, wherein exposing and developing for patterning are performed, by using the exposing and developing device, on the back face of the metal substrate on which the photoresist film has been applied in step 6, to partially remove and pattern the photoresist film, to expose a pattern of regions on the back face of the metal substrate to be plated subsequently;

step 8, plating a high electrical conductive metal wiring layer, wherein the high electrical conductive metal wiring layer is plated on the regions on the back face of the metal substrate exposed by removing partially the photoresist film in step 7;

step 9, removing the photoresist films,
wherein the photoresist films on the surfaces of the metal substrate are removed;
step 10, performing epoxy resin molding,
wherein the epoxy resin molding for protection function is performed on a surface of the metal wiring layer on the back face of the metal substrate;
step 11, performing grinding on a surface of the epoxy resin,
wherein the grinding is performed on the surface of the epoxy resin after the epoxy resin molding is performed;
step 12, applying photoresist films,
wherein the photoresist films for exposing and developing are applied on the front face and the back face of the metal substrate on which step 11 has been performed;
step 13, removing partially the photoresist film on the front face of the metal substrate,
wherein exposing and developing for patterning are performed, by using the exposing and developing device, on the front face of the metal substrate on which the photoresist film has been applied in step 12, to partially remove and pattern the photoresist film, to expose a pattern of a region on the front face of the metal substrate where etching is to be performed subsequently;
step 14, performing chemical etching,
wherein the chemical etching is performed on the region on the front face of the metal substrate where exposing and developing have been performed in step 13;
step 15, applying photoresist films,
wherein the photoresist films for exposing and developing are applied on the front face and the back face of the metal substrate on which step 14 has been performed;
step 16, removing partially the photoresist film on the front face of the metal substrate,
wherein exposing and developing for patterning are performed, by using the exposing and developing device, on the front face of the metal substrate on which the photoresist film has been applied in step 15, to partially remove and pattern the photoresist film, to expose a pattern of regions on the front face of the metal substrate to be plated subsequently;
step 17, plating metal pillars,
wherein the metal pillars are plated on the regions on the front face of the metal substrate exposed by removing partially the photoresist film in step 16;
step 18, removing the photoresist films,
wherein the photoresist films on the surfaces of the metal substrate are removed;
step 19, installing a chip,
wherein the chip is installed on a pad and pins, for which step 18 has been performed, with underfill in a flip manner;
step 20, performing encapsulating,
wherein the front face of the metal substrate processed in step 19 is molded with molding compound;
step 21, performing grinding on a surface of the epoxy resin,
wherein the grinding is performed on the surface of the epoxy resin after the epoxy resin molding has been performed in step 20; and
step 22, plating an anti-oxidation metal layer or coating antioxidant,
wherein the anti-oxidation metal layer is plated on exposed metal surfaces of the metal substrate on which step 21 has been performed or the antioxidant is coated on the exposed metal surfaces.

2. A first-etched and later-packaged flip chip three-dimensional system-in-package metal circuit board structure manufactured by the method according to claim 1, comprising: a metal substrate frame (1); a pad (2) and pins (3) disposed inside of the metal substrate frame (1); a chip (5) installed on front faces or back faces of the pad (2) and the pins (3) with underfill (4) in a flip manner; electrical conductive pillars (7) disposed on front faces or back faces of the pins (3); molding compound (8) encapsulated at a peripheral region of the pad (2), a region between the pad (2) and the pins (3), a region between the pins (3), a region above the pad (2) and the pins (3), a region below the pad (2) and the pins (3) and outside of the chip (5) and the electrical conductive pillars (7), wherein a top of the molding compound (8) flushes with tops of the electrical conductive pillars (7), and an anti-oxidation layer (9) is plated on or antioxidant (9) is coated on surfaces of the metal substrate frame (1), the pins (3) and the electrical conductive pillars (7) exposing out of the molding compound (8).

3. A first-etched and later-packaged flip chip three-dimensional system-in-package metal circuit board structure manufactured by the method according to claim 1, comprising: a metal substrate frame (1) and a chip (5); pins (3) disposed inside of the metal substrate frame (1), the chip (5) being installed on front faces or back faces of the pins (3) with underfill (4) in a flip manner; electrical conductive pillars (7) disposed on the front faces or the back faces of the pins (3); molding compound (8) encapsulated at a region between the pins (3), a region above the pins (3), a region below the pins (3), and outside of the chip (5) and the electrical conductive pillars (7), wherein a top of the molding compound (8) flushes with tops of the electrical conductive pillars (7); and an anti-oxidation layer (9) is plated on or antioxidant (9) is coated on surfaces of the metal substrate frame (1), the pins (3) and the electrical conductive pillars (7) exposing out of the molding compound (8).

4. The first-etched and later-packaged flip chip three-dimensional system-in-package metal circuit board structure according to claim 2, further comprising a passive device (10) connected between the pins (3) via electrical conductive adhesive substance, wherein the passive device (10) is connectable between front faces of the pins (3) or between back faces of the pins (3).

5. The first-etched and later-packaged flip chip three-dimensional system-in-package metal circuit board structure according to claim 2, wherein the electrical conductive pillars (7) are arranged into a plurality of rings.

6. The first-etched and later-packaged flip chip three-dimensional system-in-package metal circuit board structure according to claim 4, wherein the electrical conductive pillars (7) are arranged into a plurality of rings.

7. The first-etched and later-packaged flip chip three-dimensional system-in-package metal circuit board structure according to claim 3, further comprising a passive device (10) connected between the pins (3) via electrical conductive adhesive substance, wherein the passive device (10) is connected between front faces of the pins (3) or between back faces of the pins (3).

8. The first-etched and later-packaged flip chip three-dimensional system-in-package metal circuit board structure according to claim 2, further comprising an electro-static discharge ring (11) disposed between the pad (1) and the pins (2), wherein a front face of the chip (5) and a front face of the electro-static discharge ring (11) are connected by a metal wire (6).

9. The first-etched and later-packaged flip chip three-dimensional system-in-package metal circuit board structure according to claim 8, wherein the electrical conductive pillars (7) are arranged into a plurality of rings.

10. The first-etched and later-packaged flip chip three-dimensional system-in-package metal circuit board structure according to claim 2, wherein a plurality of chips (5) are installed on the pad (2) and the pins (3) with the underfill (4) in a flip manner.

11. The first-etched and later-packaged flip chip three-dimensional system-in-package metal circuit board structure according to claim 8, wherein a plurality of chips (5) are installed on the pad (2) and the pins (3) with the underfill (4) in a flip manner.

12. The first-etched and later-packaged flip chip three-dimensional system-in-package metal circuit board structure according to claim 9, wherein a plurality of chips (5) are installed on the pad (2) and the pins (3) with the underfill (4) in a flip manner.

13. The first-etched and later-packaged flip chip three-dimensional system-in-package metal circuit board structure according to claim 2, further comprising a second chip (12) disposed on a front face of the chip (5) via electrical conductive adhesive substance or non-electrical conductive adhesive substance (4), and a front face of the second chip (12) is connected to the pins (3) by metal wires (6).

14. The first-etched and later-packaged flip chip three-dimensional system-in-package metal circuit board structure according to claim 8, further comprising a second chip (12) disposed on a front face of the chip (5) via electrical conductive adhesive substance or non-electrical conductive adhesive substance (4), and the front face of the second chip (12) is connected to the pins (3) by metal wires (6).

15. The first-etched and later-packaged flip chip three-dimensional system-in-package metal circuit board structure according to claim 9, further comprising a second chip (12) disposed on a front face of the chip (5) via electrical conductive adhesive substance or non-electrical conductive adhesive substance (4), and the front face of the second chip (12) is connected to the pins (3) by metal wires (6).

16. The first-etched and later-packaged flip chip three-dimensional system-in-package metal circuit board structure according to claim 2, further comprising second electrical conductive pillars (13) disposed on front faces or back faces of the pins (3) and a second chip (12) installed on the second electrical conductive pillars (13) in a flip manner, wherein the second electrical conductive pillars (13) and the second chip (12) are located inside of the molding compound (8).

17. The first-etched and later-packaged flip chip three-dimensional system-in-package metal circuit board structure according to claim 8, further comprising second electrical conductive pillars (13) disposed on front faces or back faces of the pins (3) and a second chip (12) installed on the second electrical conductive pillars (13) in a flip manner, wherein the second electrical conductive pillars (13) and the second chip (12) are located inside of the molding compound (8).

18. The first-etched and later-packaged flip chip three-dimensional system-in-package metal circuit board structure according to claim 9, further comprising second electrical conductive pillars (13) disposed on front faces or back faces of the pins (3), wherein the passive device (10) is installed on the second electrical conductive pillars (13), and the second electrical conductive pillars (13) and the passive device (10) are located inside of the molding compound (8).

19. A method for manufacturing a first-etched and later-packaged flip chip three-dimensional system-in-package metal circuit board, comprising:

step 1, preparing a metal substrate;

step 2, pre-plating a thin layer of copper on surfaces of the metal substrate;

step 3, applying photoresist films, wherein the photoresist films for exposing and developing are applied on a front face and a back face of the metal substrate on which the thin layer of copper has been pre-plated, respectively;

step 4, removing partially the photoresist film on the front face of the metal substrate, wherein exposing and developing for patterning are performed, by using an exposing and developing device, on the front face of the metal substrate on which the photoresist film has been applied in step 3, to partially remove and pattern the photoresist film, to expose a pattern of regions on the front face of the metal substrate to be plated subsequently;

step 5, plating a first metal wiring layer, wherein the first metal wiring layer is plated on the regions on the front face of the metal substrate exposed by partially removing the photoresist film in step 4;

step 6, applying a photoresist film, wherein the photoresist film for exposing and developing is applied on the front face of the metal substrate processed in step 5;

step 7, removing partially the photoresist film on the front face of the metal substrate, wherein exposing and developing for patterning are performed, by using the exposing and developing device, on the front face of the metal substrate on which the photoresist film has been applied in step 6, to partially remove and pattern the photoresist film, to expose a pattern of regions on the front face of the metal substrate to be plated subsequently;

step 8, plating a second metal wiring layer, wherein the second metal wiring layer, served as electrical conductive pillars for connecting the first metal wiring layer and a third metal wiring layer, is plated on the regions on the front face of the metal substrate exposed by partially removing the photoresist film in step 7;

step 9, removing the photoresist films, wherein the photoresist films on the surfaces of the metal substrate are removed;

step 10, applying a non-electrical conductive adhesive film, wherein a layer of non-electrical conductive adhesive film is applied on the front face of the metal substrate;

step 11, performing grinding on a surface of the non-electrical conductive adhesive film, wherein the grinding is performed on the surface of the applied non-electrical conductive adhesive film;

step 12, performing metallization preprocessing on the surface of the non-electrical conductive adhesive film, wherein the metallization preprocessing is performed on the surface of the non-electrical conductive adhesive film;

step 13, applying photoresist films, wherein the photoresist films for exposing and developing are applied on the front face and the back face of the metal substrate processed in step 12;

step 14, removing partially the photoresist film on the front face of the metal substrate, wherein exposing and developing for patterning are performed, by using the exposing and developing device, on the front face of the metal substrate on which the photoresist film has been applied in step 13, to partially remove and pattern the photoresist film, to expose a pattern of regions on the front face of the metal substrate where etching is to be performed subsequently;

step 15, performing etching,
wherein the etching is performed on the regions where windowing has been performed on the photoresist film in step 14;

step 16, removing the photoresist film on the front face of the metal substrate,
wherein the photoresist film on the front surface of the metal substrate is removed, to expose a pattern of metal regions to be plated subsequently;

step 17, plating the third metal wiring layer,
wherein the third metal wiring layer is plated on the front face of the metal substrate processed in step 16;

step 18, applying a photoresist film,
wherein the photoresist film for exposing and developing is applied on the front face of the metal substrate processed in step 17;

step 19, removing partially the photoresist film on the front face of the metal substrate,
wherein exposing and developing for patterning are performed, by using the exposing and developing device, on the front face of the metal substrate on which the photoresist film has been applied in step 18, to partially remove and pattern the photoresist film, to expose a pattern of regions on the front face of the metal substrate to be plated subsequently;

step 20, plating a fourth metal wiring layer,
wherein the fourth metal wiring layer, served as electrical conductive pillars for connecting the third metal wiring layer and a fifth metal wiring layer, is plated on the regions on the front face of the metal substrate exposed by partially removing the photoresist film in step 19;

step 21, removing the photoresist films,
wherein the photoresist films on the surfaces of the metal substrate are removed;

step 22, applying a non-electrical conductive adhesive film,
wherein a layer of non-electrical conductive adhesive film is applied on the front face of the metal substrate;

step 23, performing grinding on the surface of the non-electrical conductive adhesive film,
wherein the grinding is performed on the surface of the applied non-electrical conductive adhesive film;

step 24, performing metallization preprocessing on the surface of the non-electrical conductive adhesive film,
wherein the metallization preprocessing is performed on the surface of the non-electrical conductive adhesive film;

step 25, applying photoresist films,
wherein the photoresist films for exposing and developing are applied on the front face and the back face of the metal substrate processed in step 24;

step 26, removing partially the photoresist film on the front face of the metal substrate,
wherein exposing and developing for patterning are performed, by using the exposing and developing device, on the front face of the metal substrate on which the photoresist film has been applied in step 25, to partially remove and pattern the photoresist film, to expose a pattern of regions on the front face of the metal substrate where etching is to be performed subsequently;

step 27, performing etching,
wherein the etching is performed on the regions where windowing has been performed on the photoresist film in step 26;

step 28, removing the photoresist film on the front face of the metal substrate,
wherein the photoresist film on the front surface of the metal substrate is removed;

step 29, plating the fifth metal wiring layer,
wherein the fifth metal wiring layer is plated on the front face of the metal substrate processed in step 28, for forming a pad and pins on the metal substrate;

step 30, applying a photoresist film,
wherein the photoresist film for exposing and developing is applied on the front face of the metal substrate processed in step 29;

step 31, removing partially the photoresist film on the back face of the metal substrate,
wherein exposing and developing for patterning are performed, by using the exposing and developing device, on the back face of the metal substrate on which the photoresist film has been applied in step 30, to partially remove and pattern the photoresist film, to expose a pattern of a region on the back face of the metal substrate where etching is to be performed subsequently;

step 32, performing chemical etching,
wherein the chemical etching is performed on the region on the back face of the metal substrate where exposing and developing have been performed in step 31 up to the metal wiring layer;

step 33, applying a photoresist film,
wherein the photoresist film for exposing and developing is applied on the back face of the metal substrate on which the chemical etching has been performed in step 32;

step 34, removing partially the photoresist film on the back face of the metal substrate,
wherein exposing and developing for patterning are performed, by using the exposing and developing device, on the back face of the metal substrate on which the photoresist film has been applied in step 33, to partially remove and pattern the photoresist film, to expose a pattern of regions on the back face of the metal substrate to be plated subsequently;

step 35, plating metal pillars,
wherein the metal pillars are plated on the regions on the back face of the metal substrate exposed by removing partially the photoresist film in step 34;

step 36, removing the photoresist films,
wherein the photoresist films on the surfaces of the metal substrate are removed;

step 37, installing a chip,
wherein the chip is installed on back faces of the pad and the pins, for which step 36 has been performed, in a flip manner;

step 38, performing encapsulating,
wherein the back face of the metal substrate processed in step 37 is molded with molding compound;

step 39, performing grinding on the surface of the epoxy resin,
wherein the grinding is performed on the surface of the epoxy resin after epoxy resin molding has been performed in step 38; and step 40, plating an anti-oxidation metal layer or coating antioxidant,
wherein the anti-oxidation metal layer is plated on exposed metal surfaces of the metal substrate on which step 39 has been performed or antioxidant is coated on the exposed metal surfaces.

20. The method for manufacturing a first-etched and later-packaged flip chip three-dimensional system-in-package metal circuit board according to claim 19, wherein steps 6 to 17 are performed repeatedly for forming additional metal wiring layers.

* * * * *